(12) United States Patent
Wolterink et al.

(10) Patent No.: US 12,411,413 B2
(45) Date of Patent: Sep. 9, 2025

(54) SYSTEM AND METHOD FOR MITIGATING TRAILING EDGE VOIDS IN FLEXO PRINTING

(71) Applicant: Esko-Graphics Imaging GmbH, Itzehoe (DE)

(72) Inventors: Jörg Wolterink, Oelixdorf (DE); Thomas Hänsel, Elmshorn (DE); Christian Greve, Itzehoe (DE); Frank Grewling, Breitenberg (DE); Karsten Stubbe-Thierer, Itzehoe (DE); Wolfgang Sievers, Kremperheide (DE); Peter Morisse, Bornem (BE)

(73) Assignee: Esko-Graphics Imaging GmbH, Itzehoe (DE)

( * ) Notice: Subject to any disclaimer, the term of this patent is extended or adjusted under 35 U.S.C. 154(b) by 194 days.

(21) Appl. No.: 18/039,766

(22) PCT Filed: Nov. 30, 2021

(86) PCT No.: PCT/EP2021/083548
§ 371 (c)(1),
(2) Date: Jun. 1, 2023

(87) PCT Pub. No.: WO2022/117555
PCT Pub. Date: Jun. 9, 2022

(65) Prior Publication Data
US 2024/0017541 A1    Jan. 18, 2024

Related U.S. Application Data

(60) Provisional application No. 63/119,988, filed on Dec. 1, 2020.

(51) Int. Cl.
G03F 7/20       (2006.01)
B41F 33/00     (2006.01)
(Continued)

(52) U.S. Cl.
CPC ........ *G03F 7/2016* (2013.01); *B41F 33/0009* (2013.01); *B41M 1/04* (2013.01);
(Continued)

(58) Field of Classification Search
None
See application file for complete search history.

(56) References Cited

U.S. PATENT DOCUMENTS 10,150,319 B1 * 12/2018 Bielak .................. G03F 7/2016
2005/0157347 A1    7/2005 Dewitte
(Continued)

FOREIGN PATENT DOCUMENTS

EP    2176073 A1    4/2010

OTHER PUBLICATIONS

International Preliminary Report on Patentability for International Application No. PCT/EP2021/083548, dated May 30, 2023, 8 pages.
(Continued)

*Primary Examiner* — Joshua D Zimmerman
(74) *Attorney, Agent, or Firm* — Buchanan Ingersoll & Rooney PC

(57) ABSTRACT

Methods, systems, and non-transitory memory media embodying computer readable instructions for minimizing voids in front of a trailing edge of a solid rendition or linework print region printed using a photocurable flexographic printing plate having a printing surface corresponding to information in an image file. At least one solid rendition or linework image region corresponding to the solid rendition or linework print region has a pattern of "on" and "off" single pixels that correspond to openings formed by an imager in a mask layer of the plate. Micro-screen openings in an edge region of the solid rendition or linework mask region are imaged with a different size than micro-screen
(Continued)

openings in a center region of the solid rendition or linework mask region.

27 Claims, 15 Drawing Sheets

(51) Int. Cl.
*B41M 1/04* (2006.01)
*G06T 7/00* (2017.01)
*G06T 7/13* (2017.01)
*B41N 1/12* (2006.01)

(52) U.S. Cl.
CPC .......... *G03F 7/2053* (2013.01); *G06T 7/0004* (2013.01); *G06T 7/13* (2017.01); *B41N 1/12* (2013.01); *G06T 2207/30144* (2013.01)

(56) References Cited

U.S. PATENT DOCUMENTS

| | | | |
|---|---|---|---|
| 2007/0081194 | A1 | 4/2007 | McCrea et al. |
| 2010/0224091 | A1* | 9/2010 | Zwadlo ..................... B41C 1/00 101/401.1 |
| 2016/0101614 | A1 | 4/2016 | Bielak |
| 2016/0221379 | A1* | 8/2016 | Namba ..................... B41N 1/12 |
| 2018/0354288 | A1 | 12/2018 | Bielak |
| 2019/0315141 | A1 | 10/2019 | Morisse et al. |
| 2021/0385353 | A1 | 12/2021 | Morisse et al. |

OTHER PUBLICATIONS

International Search Report and Written Opinion for International Application No. PCT/EP2022/083548, dated Apr. 4, 2022, 10 pages.

\* cited by examiner

SYSTEM AND METHOD FOR MITIGATING TRAILING EDGE VOIDS IN FLEXO PRINTING

CROSS-REFERENCE TO RELATED APPLICATIONS

This application is a U.S. National Phase Patent Application of PCT Patent Application No. PCT/EP2021/083548, filed Nov. 30, 2021, which is related to and claims priority from U.S. Provisional Application Ser. No. 63/119,988, filed Dec. 1, 2020, titled SYSTEM AND METHOD FOR MITIGATING TRAILING EDGE VOIDS IN FLEXO PRINTING, the contents of each of which are incorporated herein by reference in their entireties for all purposes.

BACKGROUND OF THE INVENTION

It is a known problem in flexographic printing that the trailing edges of solid printed surfaces on a flexographic printing plate often have a row of pinholes in the ink film shortly before the printing plate loses contact with the printing substrate. This effect is independent from the type of printing surface structure and occurs in conventional solid regions as well as in solid regions covered with micro screens.

FIG. 1A illustrates the problem. FIG. 1A is a photograph of a printed region on a first substrate printed using a first plate formed using a first set of pixel boost parameters to form the corresponding mask, wherein the printed region exhibits voids on the trailing edge side. As depicted, the printing plate (not shown) rolls in direction of the arrow 102 over the printing substrate 104. The printed region 100, which comprises a line, also referred to herein as a "linework print region," has voids 101 (areas in which the relatively lighter substrate is visible through the relatively darker ink) on the trailing edge side 106 of the line. As used herein, the term "trailing edge side" refers to the side where the printing plate surface lifts off from the substrate.

Numerous approaches have been tried for resolving this trailing edge void problem, including but not limited to approaches detailed in U.S. Pat. No. 10,150,319 as well as in U.S. Published Pat. App. Nos. US20180354288A1, US20100224091A1, and US20160221379A1.

Nonetheless, there remains a need in the art for new approaches to avoid or reduce voids.

Early laser imagers, such as the Cyrel Digital Imager (CDI) sold by Esko Graphic-Imaging GmbH of Itzehoe, Germany, completely remove corresponding portions of the mask from the polymer plate corresponding to all solid printed regions of the image by means of a laser beam modulated by an acousto-optical deflector. Later, after the discovery that micro-structures in solid regions provide better ink transfer, the use of "Pixel Boost" technology (e.g. boosting the laser power when ablating the portion of the mask corresponding to selected pixels relative to others, based on predetermined criteria) has become a standard technique employed by Esko in CDI imagers over the last decade. The boosting is accomplished by increasing the RF signal to the acousto-optical deflector accordingly. Pixel boosting allows creation of micro screens in the mask of a digital photopolymer printing plate (e.g. DuPont Cyrel DPR) by ablating only individual single pixels. These single pixels are arranged in patterns that form surface structures in regions of the plate intended to transfer ink to the print substrate. The capability of ink transfer of such surface structures is optimized by choosing an optimum size for the individual mask openings. The size of the mask openings can be altered by adjusting the energy of the laser pulse that creates the mask opening.

When imaging a laser-ablateable mask in a CDI, the mask openings are cut by a multitude of beams simultaneously. This multitude of beams can be operated in two different modes: standard imaging mode or pulsed mode. In standard imaging mode, the laser power for each individual beam is selected in a way that the size of the mask opening just slightly overlaps with the mask openings cut by neighbouring beams. The beams are switched "on" continuously in solid rendition areas, according to the image information of the image to be printed, such that the opening in a mask for a solid rendition area extends across the entire solid rendition area. As used here, the term "solid rendition area" refers to an area of an image to which a halftone screen has not been applied, which image areas may also include "linework"—e.g. solid lines within a graphic image). This mode is used for standard imaging, and creates solid rendition screened areas, including linework, having no surface structures (e.g. while highlight areas may comprise a plurality of discrete and separated halftone dots formed on the plate, the surface of each solid rendition area is not textured). The laser power for each beam in this mode is nominally considered to be at 100% power.

In pulsed mode, the beams are turned on for short periods. Not all beams are turned on at the same time. Instead, the beams are turned on in certain sequences, forming patterns of mask openings that build surface structures that are suitable for improved ink transfer. An exemplary method for forming such surface structures is disclosed in U.S. Published Patent Application No. US2019315141A1, filed by the same inventors as the present invention, assigned to an affiliate of the assignee of the present invention, and incorporated herein by reference.

To distinguish image pixels that should be boosted from conventional pixels that are imaged without boosting, boosted pixels usually consist only of isolated pixels (i.e. an "on" pixel that does not touch any other "on" pixels) or isolated lines of pixels (i.e. a 2×1, 3×1, 4×1, etc. row, column, or diagonal of "on" pixels, with no other "on" pixels touching any of the "on" pixels in the line). Isolated pixels and isolated lines have in common that no three "on" pixels are in contact with one another (as would be the case for an "on" pixel with "on" pixels touching two adjacent edges, wherein the adjacent pixels touch one another at the corners on the diagonal). Thus, a determination that a pixel or line of pixels is "isolated" is used to trigger the boosting of the pixel or line. FIG. 3A shows such isolated "on" pixels 304, surrounded by "off" pixels 302 in an exemplary MCWSI micro screen 300, which is a commonly used screen in ESKO CDI imagers. FIGS. 3B-3E show other state-of-the-art micro screen patterns, 310, 312, 314, and 316, respectively. FIG. 4A shows a sketch of mask openings 402 in mask 400 corresponding to a single pixel pattern imaged at the nominal 100% laser power. (Gridlines are shown for illustrative purposes only). The mask opening at the nominal 100% Laser power is very small; thus, the laser power for single pulses is boosted to a higher level. Changing the boost level allows to control the size of the mask openings, which leads to different sizes and shapes of the surface structures in the completely processed plates. FIG. 4B depicts corresponding mask openings at different higher boost levels, between approximately 250 and 450%, namely openings 404 at 250%, openings 406 at 350%, and openings 408 at 450%.

The different sizes of mask openings result in different structures on the completely processed polymer plate. These structures can be varied from individually separate standing micro screen dots to dots all touching another, leaving only small holes in between. Controlling the surface structures in the completely processed plate allows adjusting the surface properties of the plate for optimum print properties.

Usually the optimum print properties are evaluated from a compromise between different aspects. Among them:
  Highest solid ink density
  Closed ink film
  No visible structures in the ink film
  Precise edge definition of the vignettes Because the boost setting for optimum print result differs depending on the plate type, printing press, and ink conditions, it is a common procedure to perform a step test. In a step test for a given plate type, an image with different test patterns having a micro screen (e.g. as shown in any of FIGS. 3A-3E) is repeatedly imaged onto the mask of the plate. With each repeat, the pixel boost is increased. In the imager, the number of samples and the step width can be pre-set. In a common step test, the pixel boost may range from 200 to 450%, having a step width of 25% from one sample to the next. After the polymer plate has been completely processed, it is printed under preferably the same print conditions as expected future production jobs. This print is analysed. The boost value of the sample that most successfully meets most of the criteria listed above is chosen for this plate for future print jobs on the same printing press.

Thus, there also remains a need in the art for optimizing the application of pixel boosting.

SUMMARY OF THE INVENTION

One aspect of the invention relates to a method for minimizing voids in front of a trailing edge of a solid rendition or linework print region printed using a flexographic printing plate having a printing surface corresponding to information in an image file. The information in the image file includes at least one solid rendition or linework image region corresponding to the solid rendition or linework print region. The at least one solid rendition or linework image region includes micro-screen information comprising a pattern of "on" and "off" single pixels. The flexographic printing plate comprises a photopolymer cured through openings in a mask layer of the plate formed by an imager. The mask layer has a solid rendition or linework mask region corresponding to each solid rendition or linework print region. The method comprises providing mask micro-screen openings in an edge region of the solid rendition or linework mask region that have a different size than micro-screen openings in a center region of the solid rendition or linework mask region. The image file information may further include at least one halftone image region including halftone screen information comprising a pattern of "on" and "off" groups of pixels, each group of pixels comprising two or more single pixels.

The method may include the steps of detecting an image file edge region in the image file corresponding to the edge region of the solid rendition or linework print region; detecting an image file center region in the image file corresponding to the center region of the solid rendition or linework print region; allocating a first laser light intensity to each "on" pixel in the edge region; allocating a second laser light intensity to each "on" pixel in the center region; and imaging the mask layer of the printing plate according to the information in the image file using the first laser light intensity for the edge region and the second laser light intensity for the center region.

The method may include determining an optimum value for the second laser light intensity for the image file, applying a predetermined ratio of second laser light intensity to first laser light intensity to determine a corresponding value for the first laser light intensity, and imaging the mask layer of the printing plate using the optimum value for the second laser light intensity and the corresponding value for the first laser light intensity. In embodiments, the predetermined ratio may be in a range 0.65-0.85, preferably in a range of 0.77-0.8, and more preferably 0.785.

In some embodiments, the method may include allocating a first micro screen having a first pattern to the corresponding edge region comprising when imaging the mask layer; and allocating a second micro screen to the corresponding center region, wherein the second micro screen has a second pattern different from the first pattern. In such embodiments, the method may further include aligning the second pattern to the first pattern to avoid a discontinuity at a transition between the first pattern and the second pattern and/or switching "off" selected "on" pixels in the edge region such that imaged areas of the mask corresponding to the edge region of the linework print region form a pattern identical to the second pattern.

Other embodiments may include allocating the first laser light intensity and the second laser light intensity in hardware or firmware of the imager. Still other embodiments may include storing information corresponding to the first laser light intensity and the second laser light intensity in the image file. In yet other embodiments, the steps of detecting the image file edge region and detecting the image file center region may be performed by the imager on a digital data stream corresponding to the imaging file.

Embodiments of the method may include allocating a gradient of laser light intensities including the first laser light intensity, the second laser light intensity, and one or more other laser light intensities different from the first light intensity and the second light intensity, in accordance with a function.

Another aspect of the invention relates to a system for minimizing voids in front of a trailing edge of a solid rendition or linework print region printed using a flexographic printing plate having a printing surface corresponding to information in an image file. The flexographic printing plate comprising a photopolymer cured through openings in a mask layer of the plate formed by an imager. The mask layer has a solid rendition or linework mask region corresponding to each solid rendition or linework print region. The openings in the solid rendition or linework mask region including micro-screen openings each corresponding to an "on" pixel in a micro-screen comprising a pattern of "on" and "off" pixels. The system comprises an imager and a controller for the imager, computer memory media programmed with a first set of machine-readable instructions corresponding to the image file, and computer memory media programmed with a second set of machine-readable instructions. The second set of instructions are configured to cause the controller for the imager to transform image information in the image file to commands for causing the imager to create openings in the mask, including instructions for causing the imager to create micro-screen openings in an edge region of the solid rendition or linework mask region that are smaller than in a center region of the linework mask region. The second set of machine-readable instructions may include instructions for causing the controller to perform the steps of detecting in the image file, an image file edge region corresponding to the edge region of the linework print region, and detecting in the image file, an image file center region corresponding to the center region of the linework print region, in which case the system is configured to allocate a first laser light intensity to each "on" pixel in the first micro screen and allocate a second laser light intensity to each "on" pixel in the second micro screen; and image the mask layer of the printing plate according to the information in the image file using the first laser light intensity for the first micro screen and the second laser light intensity for the second micro screen.

In some embodiments, the second set of machine-readable instructions may further comprise instructions for allocating a first micro screen having a first pattern to the corresponding edge region; and allocating a second micro screen to the corresponding center region, wherein the second micro screen has a second pattern different from the first pattern. In such embodiments, the second set of instructions further comprises instructions for switching "off" selected "on" pixels in the edge region such that imaged areas of the mask corresponding to the edge region of the linework print region form a pattern identical to the second pattern. In such embodiments, the imager may also comprise hardware or firmware configured to allocate the first laser light intensity and the second laser light intensity based upon the information in the image file.

In other embodiments, the first set of machine-readable instructions comprise information corresponding to the first laser light intensity and the second laser light intensity, and the system may include a raster imaging processor (RIP) configured to detect the image file edge region and the image file center region and to assign each pixel information corresponding to the first laser light intensity or the second laser light intensity.

Embodiments of the systems as described herein may be configured for allocating a gradient of laser light intensities including the first laser light intensity, the second laser light intensity, and one or more other laser light intensities different from the first light intensity and the second light intensity, in accordance with a function.

In some embodiments, the imager is configured to receive a digital data stream corresponding to the imaging file and to detect the image file edge region and the image file center region in the digital data stream. In some embodiments, the image file includes at least one halftone print region and the mask comprises a corresponding halftone mask region, wherein the halftone mask region also includes micro-screen openings, and in other embodiments, the halftone mask region has openings that do not include micro-screen openings.

Still another aspect of the invention relates to non-transitory computer readable media programmed with instructions readable by a controller of an imager configured to laser-ablate openings in a mask layer of a flexographic printing plate. The instruction correspond to information in an image file, including at least one halftone image region and at least one solid rendition or linework image region corresponding to the solid rendition or linework print region, the at least one solid rendition or linework image region including micro-screen information comprising a pattern of "on" and "off" single pixels and the at least one halftone image region including halftone screen information comprising a pattern of "on" and "off" groups of pixels, each group of pixels comprising two or more single pixels, wherein the image file comprises 3-dimensional information corresponding to each pixel, comprising at least an X-coordinate, a Y-coordinate, and a laser ablation intensity. The instructions referring to the laser ablation intensity may include instructions corresponding to a first relatively lesser laser ablation intensity in an edge region of a linework print region than a second laser ablation intensity in the center region of a linework print region. The instructions referring to the laser ablation intensity may instead or also include instructions corresponding to a gradient including the first laser light intensity, the second laser light intensity, and one or more other laser light intensities different from the first light intensity and the second light intensity, in accordance with a function.

Yet another aspect of the invention relates to non-transitory computer readable media programmed with instructions readable by a controller of an imager configured to laser-ablate openings in a mask layer of a flexographic printing plate, each opening corresponding to an "on" pixel in a micro-screen comprising a pattern of "on" and "off" pixels. The instructions are configured for causing the controller to transform image information in an image file into commands for causing the imager to create openings in the mask, including instructions for causing the imager to create mask openings in an edge region of the mask corresponding to a linework print region that are smaller than in a center region of the mask corresponding to a linework print region. The instructions may further include instructions for causing the imager to detect in the image file, an image file edge region corresponding to the edge region of the linework print region, and allocate a first micro screen having a first pattern to the corresponding edge region; and detect an image file center region corresponding to the center region of the linework print region, and allocate a second micro screen to the corresponding center region, wherein the second micro screen has a second pattern different from the first pattern. In some embodiments, the instructions may instead or also include instructions for causing the imager to allocate a first laser light intensity to each "on" pixel in the first micro screen and allocate a second laser light intensity to each "on" pixel in the second micro screen; and image the mask layer of the printing plate according to the information in the image file using the first laser light intensity for the first micro screen and the second laser light intensity for the second micro screen. In other embodiments, the instructions may instead or also include instructions for causing the imager to switch "off" selected "on" pixels in the edge region such that imaged areas of the mask corresponding to the edge region of the linework print region form a pattern identical to the second pattern. The instructions in any of the foregoing embodiments may include instructions for causing the imager to allocate a gradient of laser light intensities including the first laser light intensity, the second laser light intensity, and one or more other laser light intensities different from the first light intensity and the second light intensity, in accordance with a function.

Still another aspect of the invention relates to non-transitory computer readable media programmed with instructions readable by a controller of a raster image processor (RIP) configured to convert a first image file into a bitmap image file for use by an imager, the bitmap image file comprised of a plurality of pixels including stored information for each pixel comprising location coordinates and an imager boost intensity. The instructions may include instructions for causing the RIP to detect an edge region of a linework print region and a center region of the linework print region, and to assign imager boost intensities to pixels in the edge region that are smaller than in the center region.

Another aspect of the invention includes a raster image processor (RIP) programmed with the foregoing instructions.

Yet another aspect of the invention relates to a method for creating a flexographic printing plate having a printing surface corresponding to information in an image file, the flexographic printing plate comprising a photopolymer cured through openings in a mask layer of the plate. The method comprises storing in the image file first micro-screen information comprising a first pattern of "on" and "off" single pixels in at least one first region of the image file; storing in the image file second micro-screen information comprising a second pattern of "on" and "off" single pixels different than the first pattern in at least one second region of the image file, and detecting the first region and the second region with the imager, and forming first micro-screen openings in the mask layer corresponding to the first micro-screen information having a different opening size than second micro-screen openings corresponding to the second micro-screen information. At least one first region of the image file may correspond to an edge of a solid rendition or linework image region and the at least one second region of the image file may correspond to a center of the solid rendition or linework image region.

DETAILED DESCRIPTION OF THE INVENTION

One aspect of the invention addresses the problem of voids at trailing edges by selecting different settings for pixel boost in different regions of the printed image. Aspects of the invention also relate to specific methods for selecting the different pixel boosts for the different regions of the printed image.

As noted above, voids in solid regions located in front of trailing edges on flexographic prints are a well-known problem, and aspects of the invention thus introduce a new approach to solve this problem by controlling the mask opening of microstructures. As described further herein, the exemplary method reduces voids in the edge region of a printout made from a flexographic printing plate by applying different micro screen imaging parameters for edge regions of printing regions than for center regions of linework details in an image of a flexographic printing plate when imaging the laser ablateable mask (LAM) of the plate. Thus, despite single (isolated) pixels of the solid rendition or linework image region of the image file having the same size in both the edge region and the center (interior) region, the corresponding micro-screen openings of the corresponding solid rendition or linework mask region have different sizes in the edge region as compared to the center region. The method disclosed herein also enables embodiments in which the screening pattern is the same in the center region and the edge region with the same size dots, but the corresponding micro-screen openings formed in the corresponding regions of the mask are different. In some embodiments, the dot pattern in the center region is composed of isolated dots (e.g. a relatively finer dot pattern) whereas the dot pattern in the edge region is composed of dot clusters (e.g. a relatively coarser dot pattern).

Although illustrated herein with respect to a plate with a LAM layer, the invention of using different mask opening sizes to minimize voids on the trailing edge as discussed herein is not limited only to LAM technology, and be applied broadly to other types of masking layers used during a curing step of a photopolymer plate, without limitation.

Figure 1A:
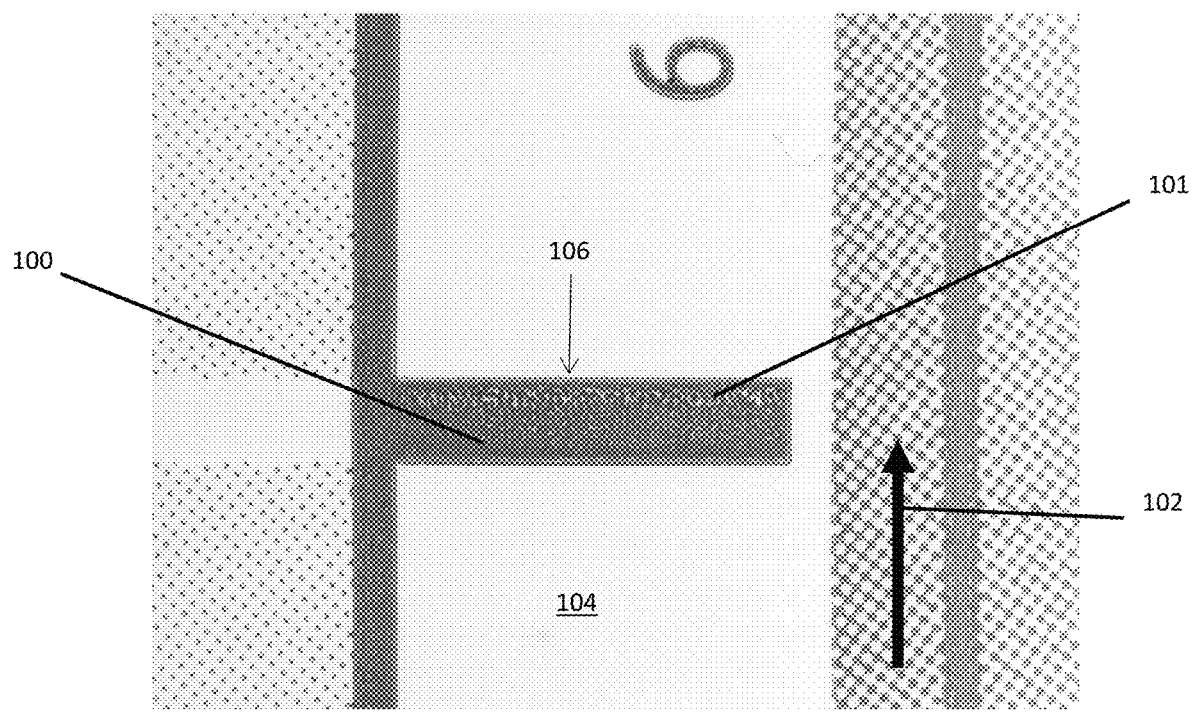
FIG. 1A is a photograph of a linework print region on a first substrate, which region exhibits voids on the trailing edge side.
Figure 1B:
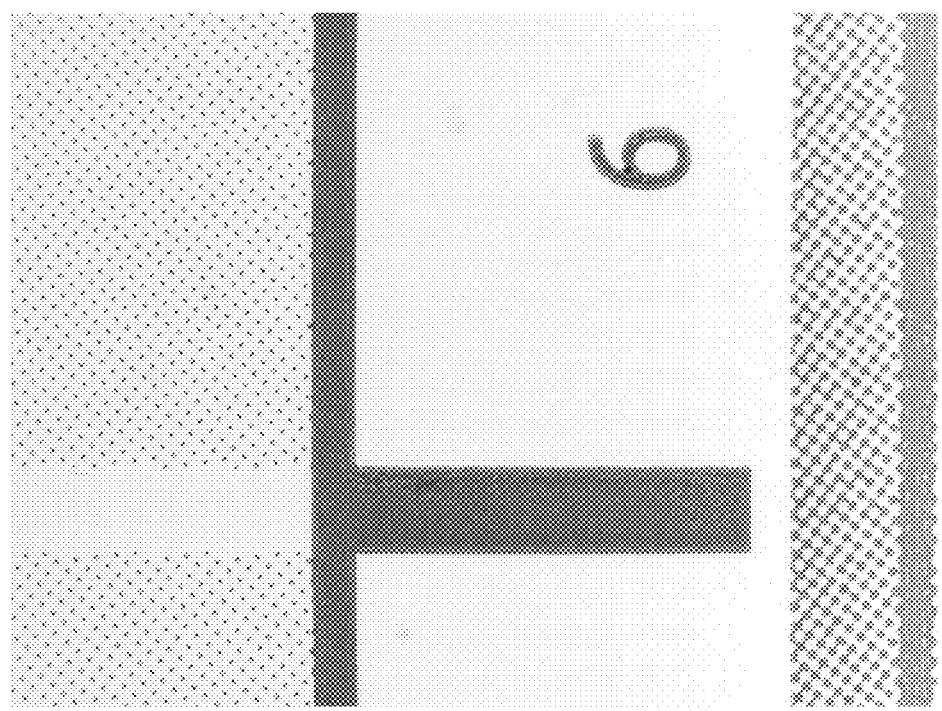
FIG. 1B is a photograph of a similar linework print region as that depicted in FIG. 1A, printed on a similar substrate using a plate formed in accordance with an exemplary method of the invention, and which region exhibits a reduction in voids on the trailing edge side relative to FIG. 1A.
Figure 2:
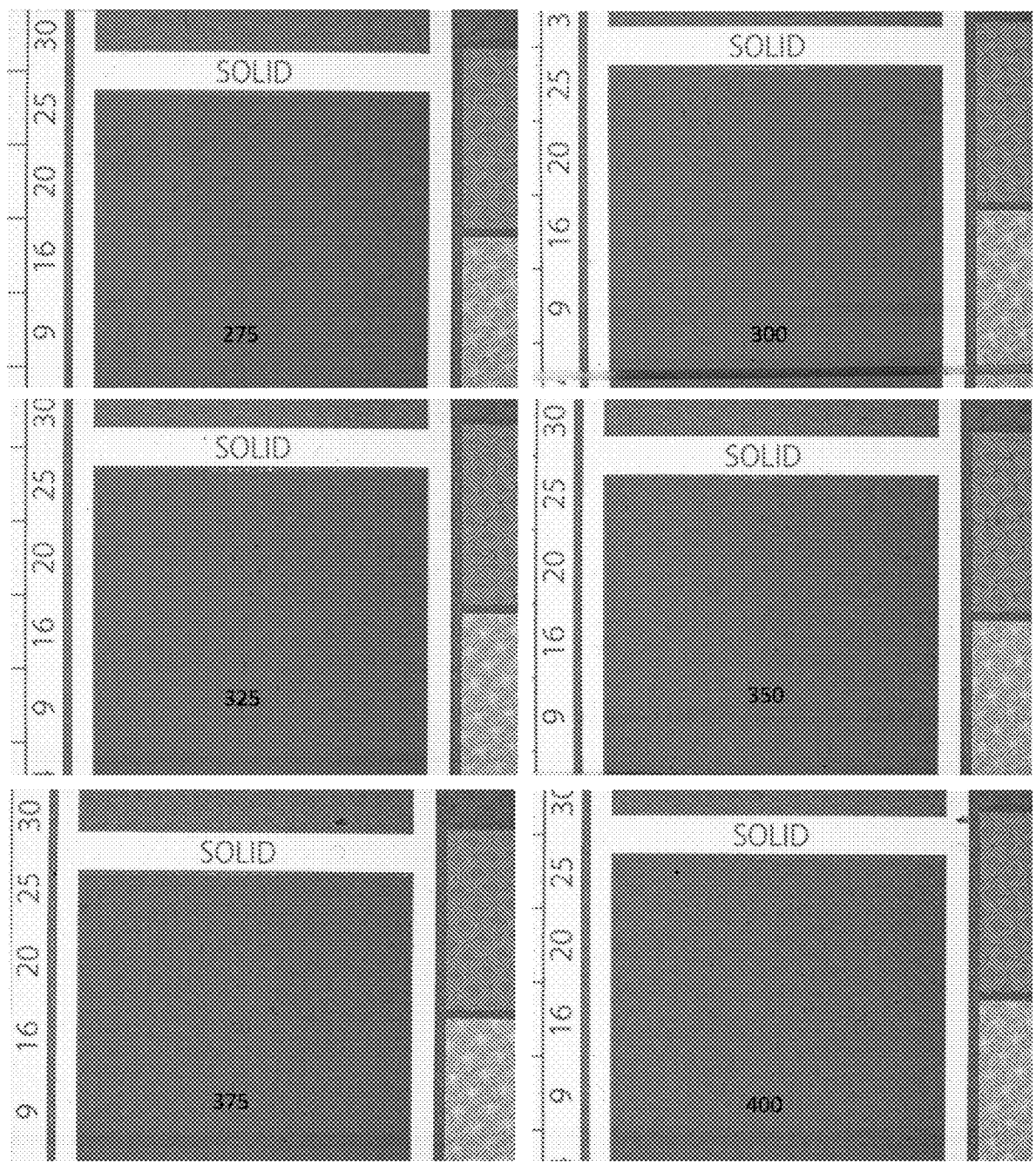
FIG. 2 is a compilation of photographs of six samples, each having the same micro structured printing detail, printed using plates produced at different levels of pixel boost, with the label on each photograph corresponding to the percentage boost (e.g. photograph labelled "275" corresponds to a pixel boost applied at 275% of nominal power).

The inventors have observed that voids before trailing edges can be avoided or reduced by selecting an optimal pixel boost. FIG. 2 is a compilation of photographs of six samples, each having the same micro structured printing detail, printed using plates produced at different levels of pixel boost, with the label on each photograph corresponding to the percentage boost (e.g. photograph labelled "275" corresponds to a pixel boost at 275% of nominal power). The sample with 275% boost has the least voids, but exhibits imperfections in ink laydown, whereas the sample with 375% boost has the best ink laydown, but exhibits more visible voids at the trailing edge.

During the analysis of step tests as described above, and as illustrated in FIG. 2, the inventors discovered that certain samples with lower boost settings showed fewer voids at the trailing edges at lower pixel boost settings. But, historically, lower boost settings typically come with a disadvantage in that the solids will not have the maximum possible solid ink density. This disadvantage can be avoided when only edge regions close to trailing edges have a reduced pixel boost, while other center regions are boosted according to the best solid ink density (SID) result.

While it is relatively straightforward to switch between two different pixel boost settings, the primary challenge is identifying the edge regions of solid print regions in an image in order to trigger a pixel boost that is different than for the centre regions.

As noted above, the pixel boost is typically triggered by isolated image pixels in the image file. In the software and hardware of the CDI, the image file is converted into a so-called "length encoded file" (LEN file), which slices the complete image into individual tracks. Each track provides image information for one imaging beam. During imaging, the tracks are analysed on-the-fly. Whenever one track delivers image information for a single pixel to be imaged without the presence of pixels to be imaged in the neighbouring tracks, the amplitude information for this pixel is elevated to a higher level.

Figure 5A:
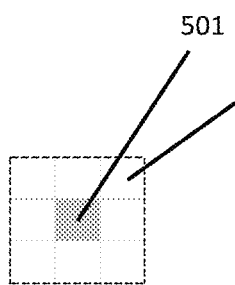
FIG. 5A depicts a 3×3 matrix including an imaging pixel surrounded by non-imaging pixels.
Figure 5B:
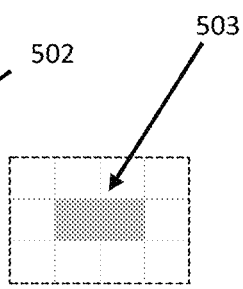
FIG. 5B depicts a 3×4 matrix including imaging pixels surrounded by non-imaging pixels.
Figure 5C:
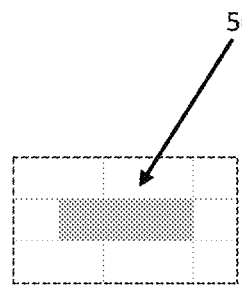
FIG. 5C depicts a 3×5 matrix including imaging pixels surrounded by non-imaging pixels.
Figure 5D:
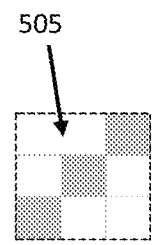
FIG. 5D depicts a 3×3 matrix including imaging pixels arranged in an isolated line on a diagonal surrounded by non-imaging pixels.

For this operation, a boost detection matrix is required. To detect a single pixel a detector matrix has to be 3×3 pixels wide. Only when the pixel in the centre is turned on while all other pixels remain off a boost are triggered. FIG. 5A shows such a 3×3 matrix. FIG. 5A depicts an isolated ("on") imaging pixel 501 surrounded by ("off") non-imaging pixels 502. FIGS. 5B and 5C, respectively, provide visualizations of 3×4 and 3×5 matrices with isolated rows of pixels 503 and 504. Such matrices may be used for detecting isolated rows of the depicted size, which in some embodiments may also be boosted. FIG. 5D provides a visualization of a 3×3 matrix with an isolated diagonal line 505 of pixels, which may be used for detecting isolated diagonal lines to be boosted (an isolated diagonal line oriented in the opposite direction will also be boosted). In operation, such matrices represent a combination of on and off pixels that can be uniquely represented in code such that combinations matching selected arrangements to be boosted are boosted, and combinations not matching are not boosted. Esko has employed boost detection matrices in relevant commercial products for many years.

To detect the edges of solid image details, much wider matrices must be employed. Usually the voids in print are between several 100 µm to 1 mm away from the edge of the print detail, meaning that the matrix needed may be as much as a 160×160 matrix for 4000 DPI file resolution. Esko has also employed edge detection matrices in relevant commercial products for many years.

Usually, many images of different print jobs are combined on a polymer printing plate during the imaging, exposure, and development process, and separated by cutting the plate into respective portions after the fully-developed printing plate has been formed. To efficiently include as many images as possible on the plate, the orientation of the images may vary significantly across a particular plate.

Because the images are not necessarily oriented the same way that they will ultimately be located on the press cylinder, it may not be clear which edge of an image detail on the imaging cylinder will be later the leading edge on the press, and therefore all outer edges of image details may be provided with a modified pixel boost.

The modified pixel boost may only be applied to solids and linework, while all screen image information (containing halftone screening) keeps the original boost. This can be established by handling linework and screens in different layers in the RIP (Raster Image Processor). Accordingly, the RIP can identify solids and linework areas as those having no associated halftone screening associated with them. The solids and linework areas can further be differentiated into edge ("outer") regions and internal ("inner") regions. In some embodiments, microscreens may also be applied to halftone areas; however, microscreens can be uniformly applied to halftone areas without a need to apply a different screen to the respective inner and outer regions as set forth herein for solid areas.

Technically, there are different approaches to mark the edge regions of solid and linework in an image file for a modified pixel boost.

Exemplary Method 1

A simple method may include detecting edges of solid regions "on the fly" during imaging and reducing pixel boost for a certain number of pixels located at these edges. This operation can be performed by the imager electronics and does not require modifications of the image file. FIG. 9B shows one non-limiting, exemplary embodiment of the data flow in a processor of an imager 950. The input image file (e.g. TIFF or PDF format) 952 is sliced into individual tracks by a slicer 954, and the individual tracks 958 are forwarded (e.g. in groups of between 2 and 64 tracks) towards the modulator unit 960, where each individual track is provided with amplitude information that corresponds to parameters such as surface speed sensitivity of the laser ablateable mask (LAM) or the boost intensity. The number of tracks forwarded typically depends on the number of beams needed for imaging. In some systems, such as those manufactured by Esko, the sliced data may be stored in an intermediate length encoded (LEN) image file 956.

The modulator unit may comprise a field programmable gate array (FPGA) implemented in hardware and firmware. In the example depicted in FIG. 9B, three files 970 (containing instructions for boosting single pixels), 972 (containing instructions for boosting "groovy"—i.e. diagonal lines of—pixels), and 974 (containing instructions for pixels without boosting) are loaded into the FPGA. In other embodiments, more types of pixels may be defined with corresponding instruction files. These instructions comprise amplitude information for the different types of imaging pixels and for masking pixels that are not supposed to be imaged. These machine-readable instructions (at least in imagers such as the Esko CDI imager) are universal and do not directly correspond to the image file, but may be prompted by information derived from the image file.

Inside the Modulator unit 960 is a section referred to herein as a boost detector 962. The boost detector 962 identifies single pixels or "groovy" pixels or other kind of pixel constellations based upon the instructions 970, 972, 974. Whenever a certain pixel constellation (e.g. a single pixel) is detected, the modulator unit looks up the amplitude information in a corresponding intensity instruction file, and applies this information to the pixel output of the image modulator 960.

Depending on the type of imager, the image Modulator output can be forwarded to a RF modulator, an LCD matrix, an array of Individual Laser diodes, or a DMD. In the example depicted in FIG. 9B, the output is forwarded to a RF modulator unit 980. This unit converts the amplitude information of the parallel image tracks 965 into different RF frequencies and sums all frequencies into a single EF signal 982 that is fed to an acousto-optic deflector 990, which creates a corresponding number of first order imaging beams from an incoming Laser beam.

Figures 3A, 3B, 3C, 3D, 3E:
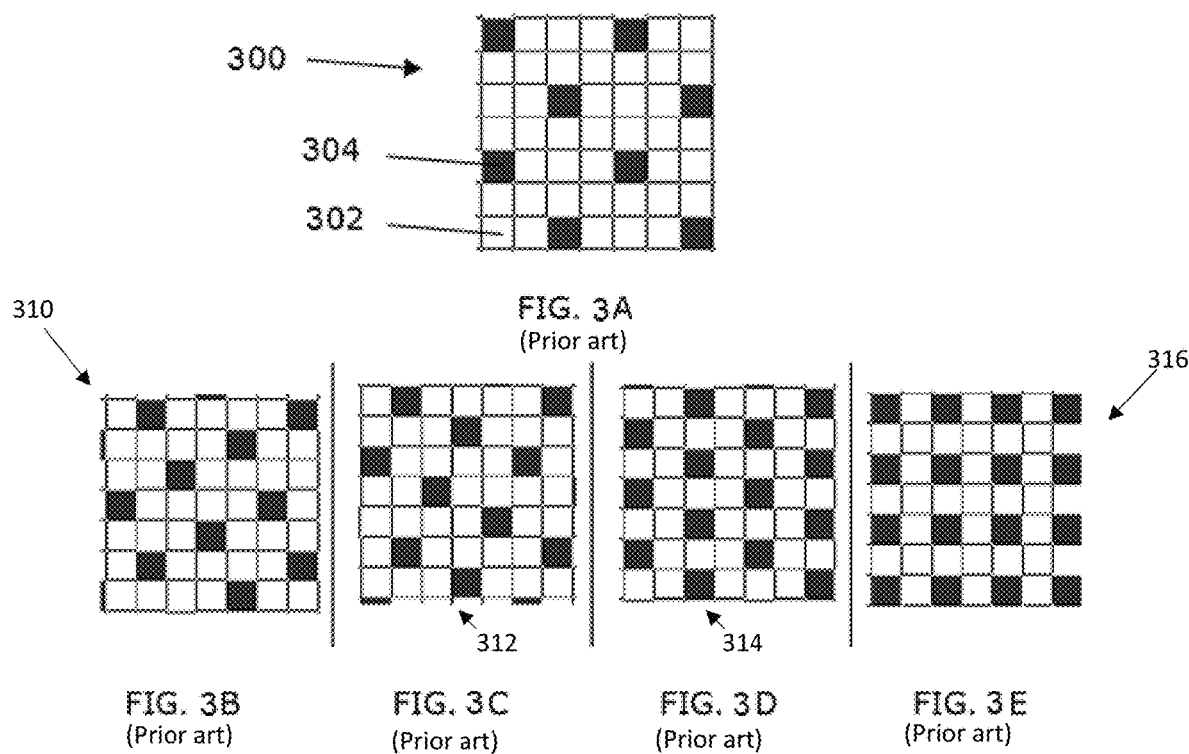
FIG. 3A a schematic illustration of pixels in an exemplary MCWSI micro screen.
FIGS. 3B-3E a schematic illustration of pixels in other state-of-art micro screen patterns.
Figure 4A:
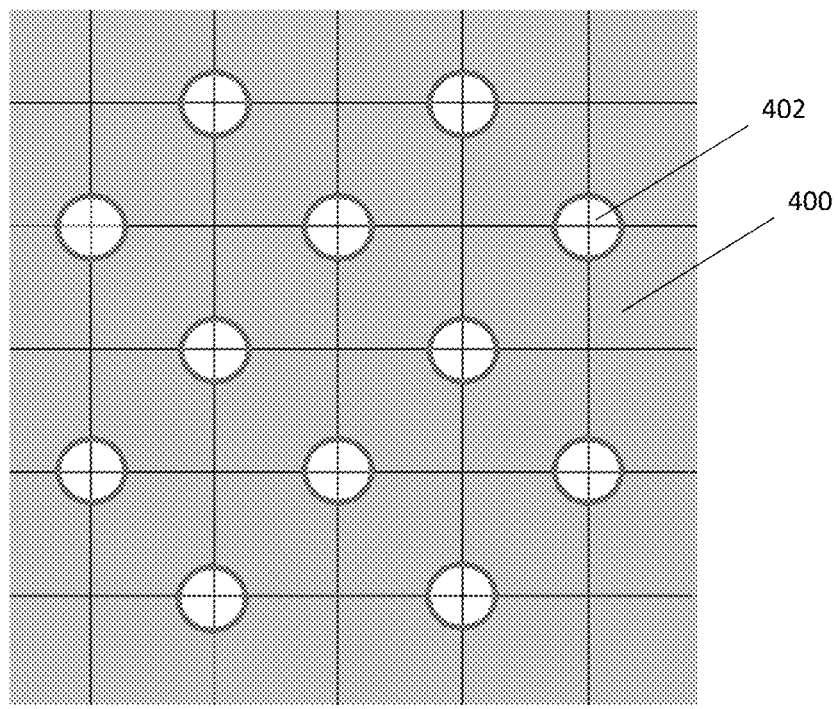
FIG. 4A a schematic illustration of exemplary mask opening for a single pixel pattern imaged at nominal 100% laser power.
Figure 4B:
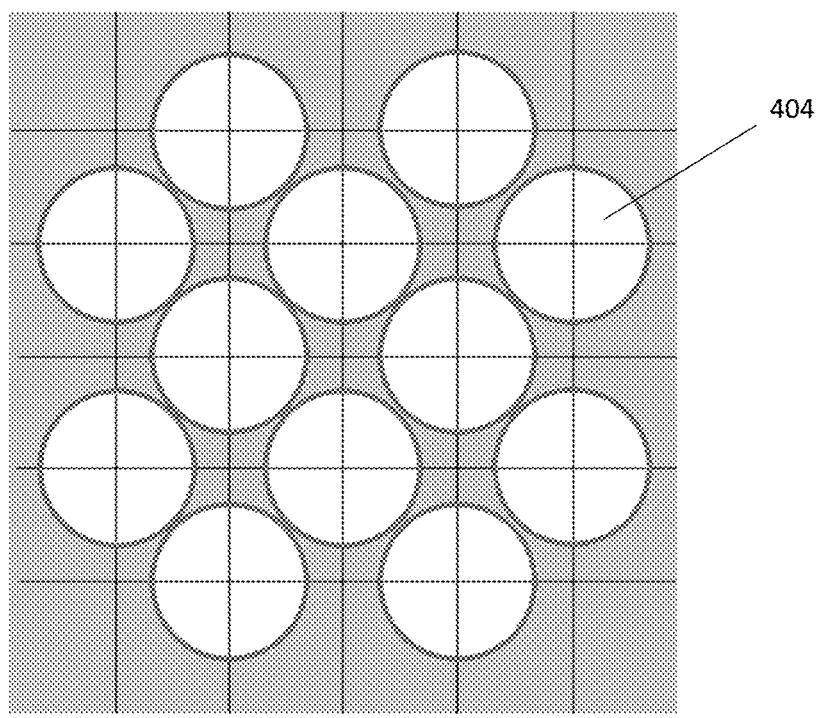
FIG. 4B is a schematic illustration of exemplary mask openings at a boost level of approximately 250% of nominal power.
Figure 4C:
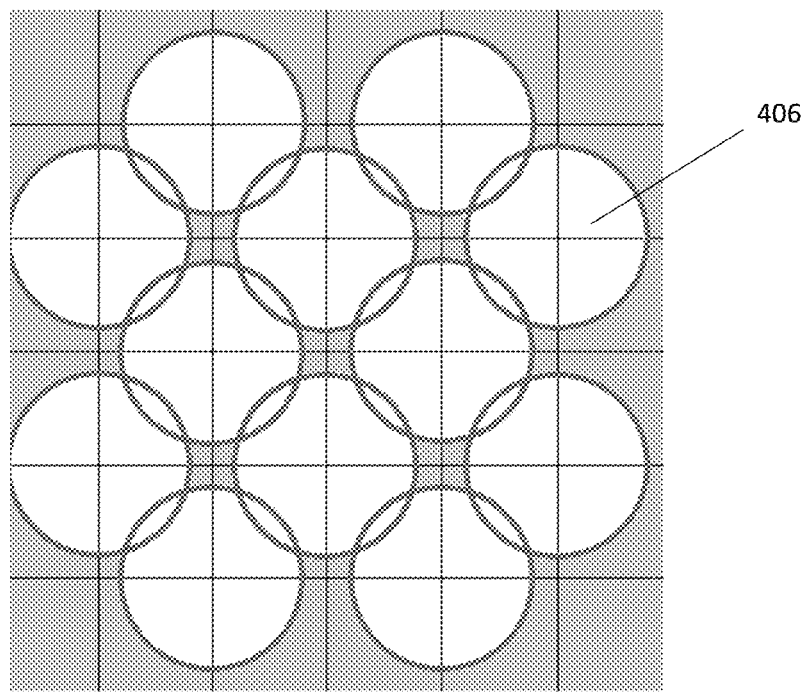
FIG. 4C is a schematic illustration of exemplary mask openings at a boost level of 350% of nominal power.
Figure 4D:
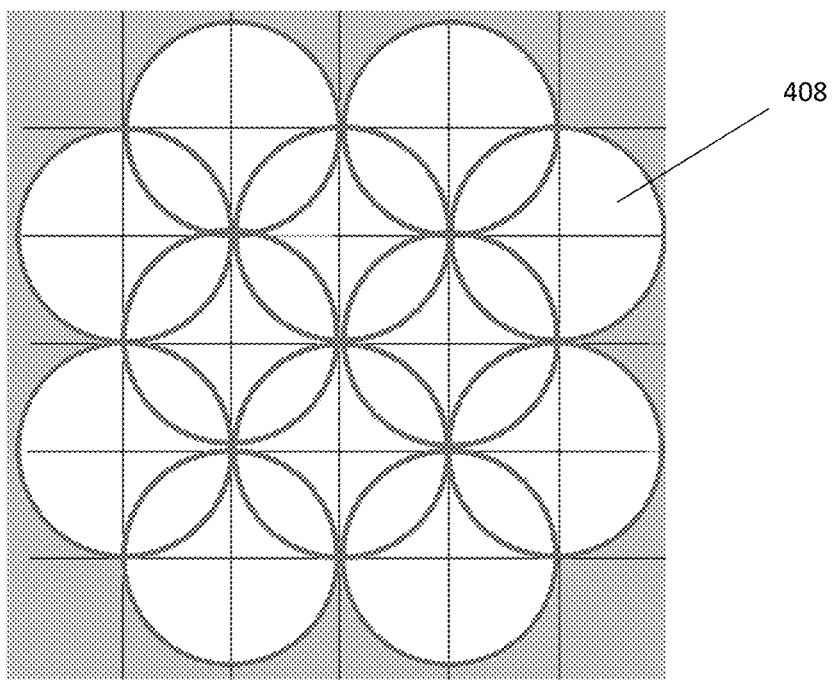
FIG. 4D is a schematic illustration of exemplary mask openings at a boost level of approximately 450% of nominal power.
Figure 11:
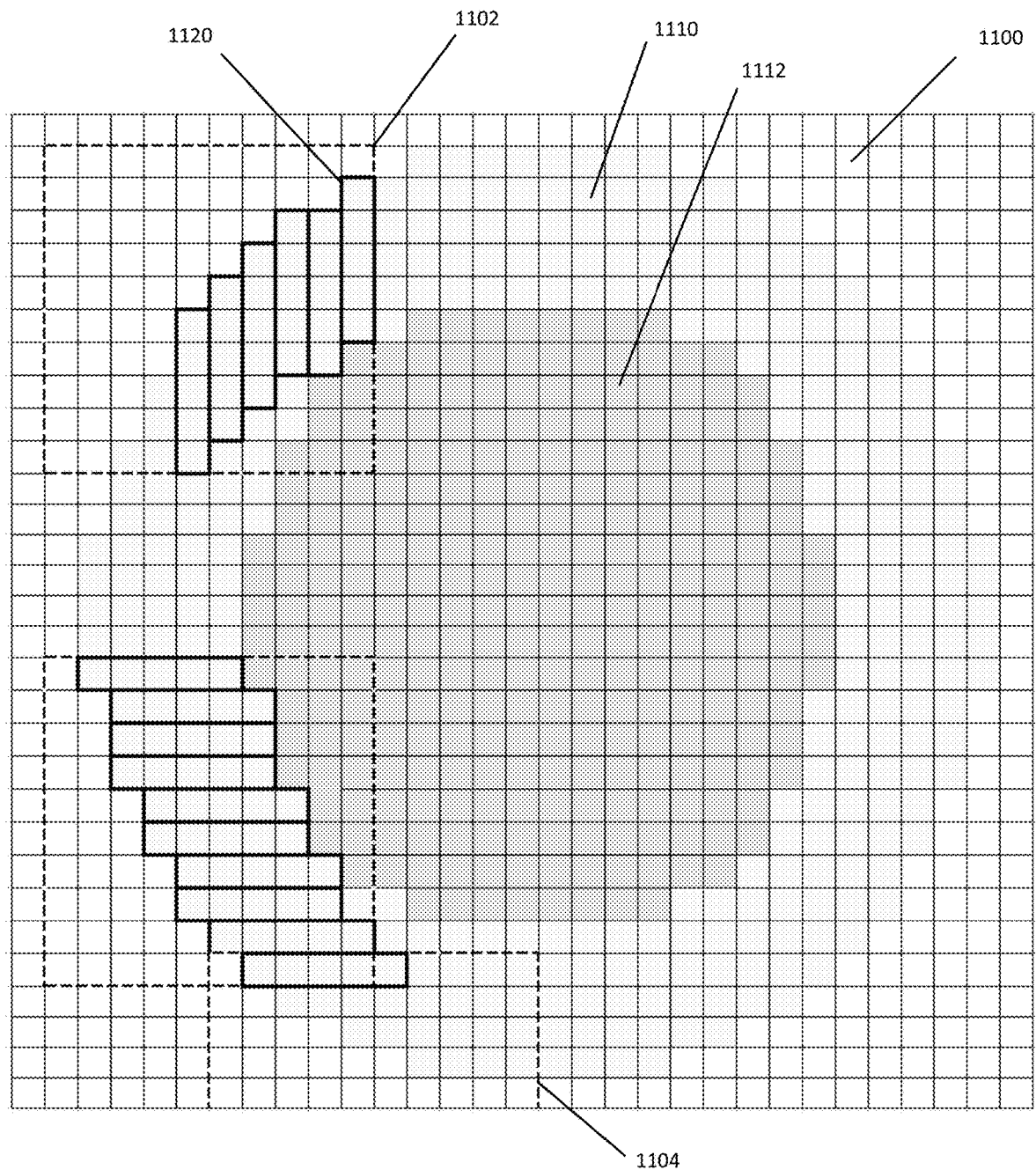
FIG. 11 is a schematic illustration of a simplified boost detector matrix for illustrating the exemplary function of a hardware/firmware on-the-fly edge detection system.

FIG. 11 shows a simplified boost detector matrix embodiment 1100 to illustrate the exemplary function of a hardware/firmware on-the-fly edge detection system. This is only one of various possible implementations, and the invention is not limited to any particular embodiment. In the embodiment illustrated in FIG. 11, each cell of the grid represents a cell containing a single pixel element belonging to a micro screen of, e.g. the type shown in FIG. 3 or a similar pattern. The cells form tiles that contain repeatable fractions of the micro screen pattern. Depending on the type of micro screen, the tiles may contain different numbers of image file pixels, thus these tiles may be several imaging tracks wide and high.

All light and dark grey cells of FIG. 11 comprise solid rendering/linework image details to be imaged into the LAM, such as a circular shaped linework detail. The light grey area 1110 represents the edge region, whereas the dark grey area 1112 represents the center region. The vertical direction of the figure may represent the circumferential direction of the imager drum while horizontal direction may represent the advance direction of the imager.

The squares bounded by dashed lines 1102, 1104 represent a window of the edge detector at different positions during scanning tracks of the LEN file cells containing single pixel elements. In the example, the width of the edge area is five cells wide. The edge detector window has twice the size of the cell scan width 1120 and works with 50% overlap from one scan to the next to make sure all edge regions are reliably detected.

In the example, the width of the edge region is five tiles wide. The solid line rectangles represent clusters of tiles in the horizontal or vertical direction that determine the distance from the outer contour of the print detail to the center region. Whenever five tiles in a row containing "on" image pixels and one tile containing "off" image pixels are detected in a horizontal or vertical direction, the edge region amplitude information is affixed to the "on" image pixels. All other tiles containing single pixels are supplied with center region amplitude information.

The window of the edge detector moves in one-pixel steps in the circumferential direction while the movement in the axial direction has a width of five tiles. If the maximum available number of imaging beams is smaller than the number of pixels contained in these five tiles in the advance direction, the tracks of several complete rotations are stored to compile a detector matrix of a suitable size.

The process described may be implemented into the FPGA of an image modulator unit, or alternatively, it may be executed in pure hardware. In other embodiments, a separate, embedded micro-controller system may be used for implementing the edge detection function.

Exemplary Method 2

In another approach, the edge regions may be detected in the RIP, and the LEN file created with 3D Image information, in which the third dimension corresponds to the pixel boost amplitude. In this embodiment, edge regions obtain boost information different from the centre regions of image details.

Intensity information stored in the third dimension may be used to provide a gradient of intensity across the edge regions. For example, the intensity may gradually decrease from a transition from the center region to the edge region toward the outer border of the edge region. The beginning of the edge region may have the same intensity as the center region intensity and decay linearly to a predetermined lower intensity at the outer border of the edge region. Alternatively, the intensity may increase again close to the outer border of the edge region to form a more precise and stable outline. Notably, the application of a gradient to the edge regions is not limited to Exemplary Method 2. Accordingly, gradients may be applied in the identified edge regions in accordance with any of the methods as discussed herein. Furthermore, the gradient is not limited to a linear decay or to any particular function of the gradient, and may include functions in which intensity values between the inner and outer borders of the edge region are all intermediate the inner and outer values, or function in which some of the values between the inner and outer borders exceed the inner or outer border values.

Exemplary Method 3

This method entails identifying all edges of solid regions during RIPping and applying a second type of micro screen to the edge regions. Both micro screens may be such that they easily can be detected in a small detector matrix of 3×3, 4×4 or 5×5 pixels, which keeps the hardware effort in the imager low. During imaging, the imager dedicates different pixel boosts to the different micro screens.

Methods 1 and 2 have pros and cons. Although Method 1 is directly retrofittable without the need to modify the image file by the RIP, it requires a relatively large hardware memory to detect an edge of a linework detail in a 100×100 Pixel matrix. Using a 3D image file, as in Method 2, is easier to implement in the hardware, but increases image data volume. Adding one more bit for pixel boost amplitude corresponding to each pixel doubles the size of the image file. Doubling the data volume may limit the imaging speed, if the doubled data volume exceeds the imager's data transfer volume per time unit.

Method 3 is a combination of Methods 1 and 2. It still uses a two-dimensional image file, which keeps the size of the data volume as-is, and it uses a smaller boost detector matrix in the hardware, which requires only minor respective hardware firmware modifications.

Figure 6A:
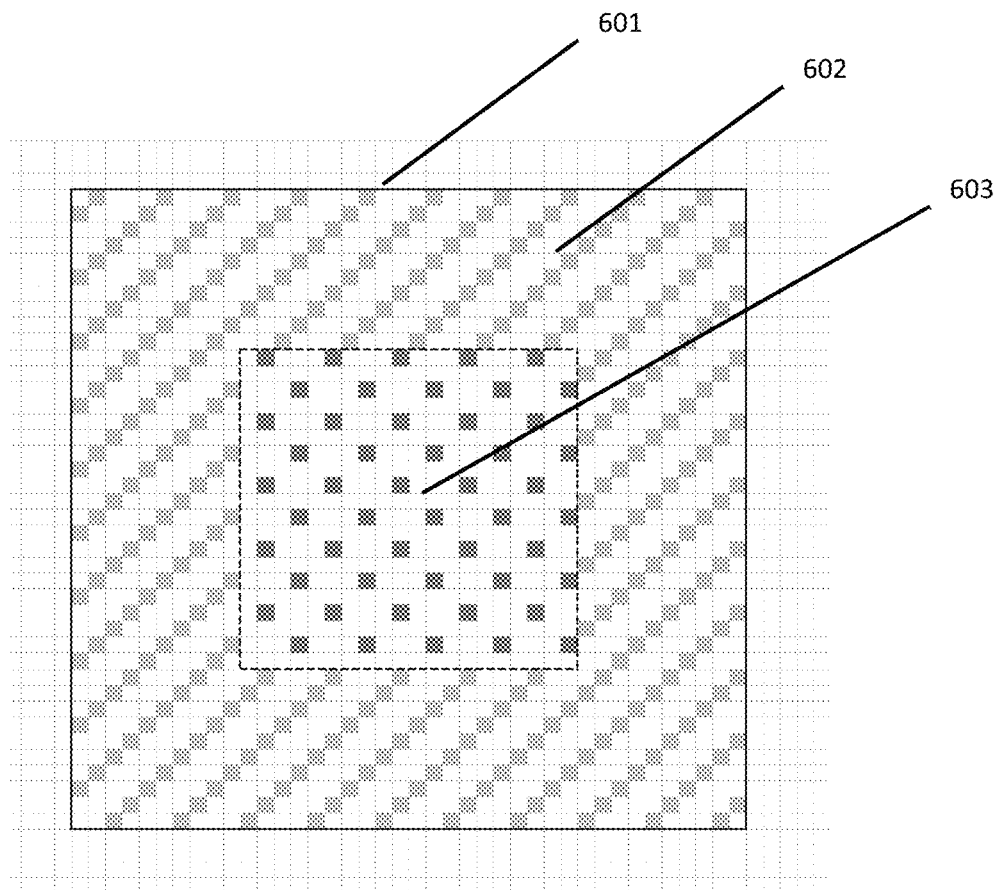
FIG. 6A depicts exemplary print detail showing a centre region with a first single pixel screen and an edge region showing a second pixel screen.
Figure 6B:
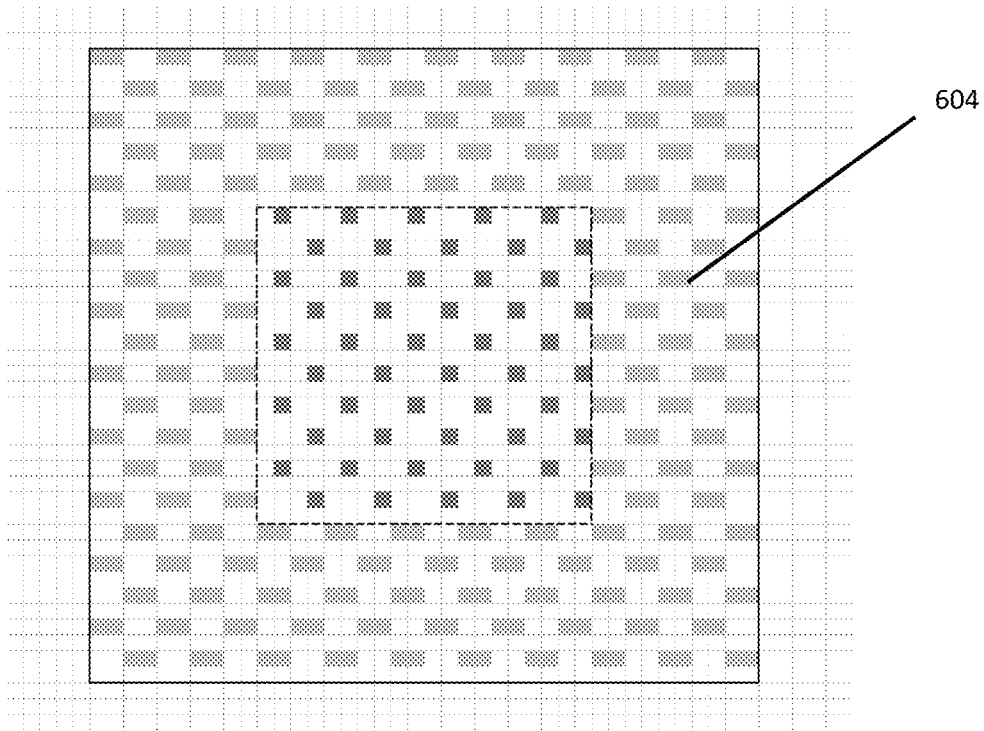
FIGS. 6B and 6C, depict exemplary print details showing the center region with the first single pixel screen of claim 6A, and edge regions with alternative second pixel edge regions.
Figure 6C:
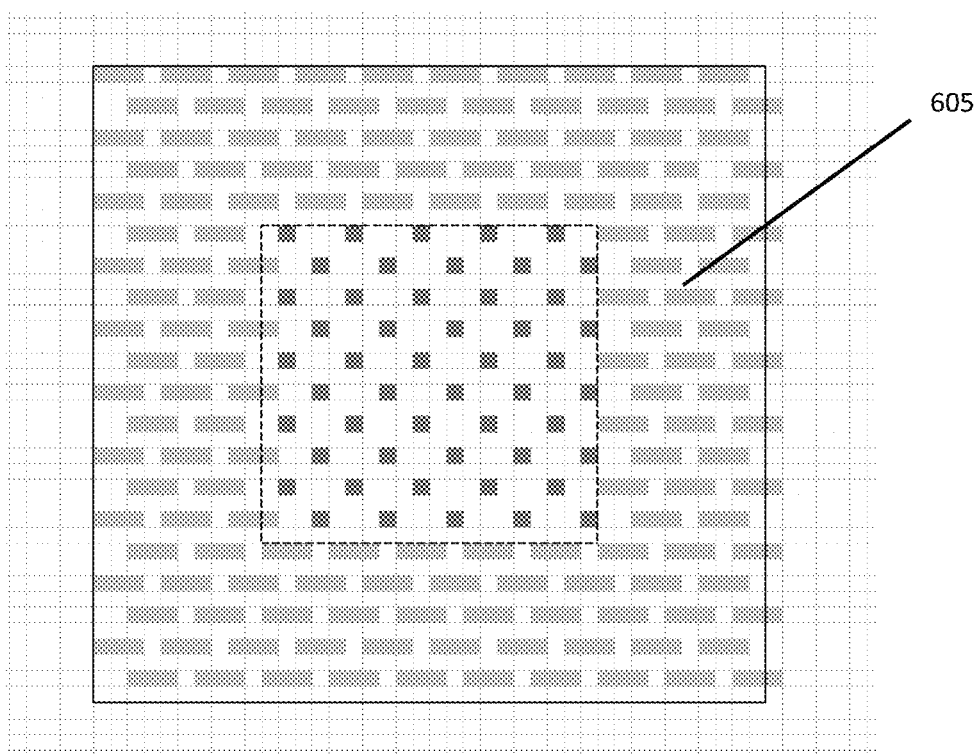

FIG. 6A shows a sample of a print detail 601 having a center region 603 containing a first single pixel screen (MCWSI-Screen) (shown with relatively darker squares to indicate a relatively greater boost intensity) and edge region 602 containing a second pixel screen (Groovy screen) (shown with relatively lighter squares to indicate a relatively lesser boost intensity). In FIGS. 6B and 6C, the edge regions 604, 605 are filled with alternative screens as compared to the edge region screen 602 of FIG. 6A. The foregoing are only examples, and should not be understood as limiting the multitude of possible screens for the edge region. In essence, any single pixel screen can be used in the edge region that differs from the single pixel screen used in the centre region. The imager hardware is then programmed with instructions for distinguishing one pattern of single pixel screen from another, and acting accordingly. For example, the imager hardware may be programmed to identify isolated pixels in a line or solid region as a center region for applying a maximum boost (e.g. 450%), and isolated diagonal lines or rows of 1×2 or 1×3 pixels for applying a lesser boost (e.g. 250%).

Many types of functions are possible to control and modify the intensity of the pixel boost to compensate other shortcomings that otherwise may occur on a printing plate when imaged with constant pixel boost.

Use of an Output Filter:

Using two different single pixel micro screens solves the problem of distinguishing edge regions from centre regions in order to dedicate different pixel boosts to the two regions. However, changing the micro screen pattern abruptly from one screen type to another may cause additional transition effects at the border between centre and edge regions. Accordingly, it may be better to have only a modification of the boost instead of modifying both pattern and boost.

Figure 7:
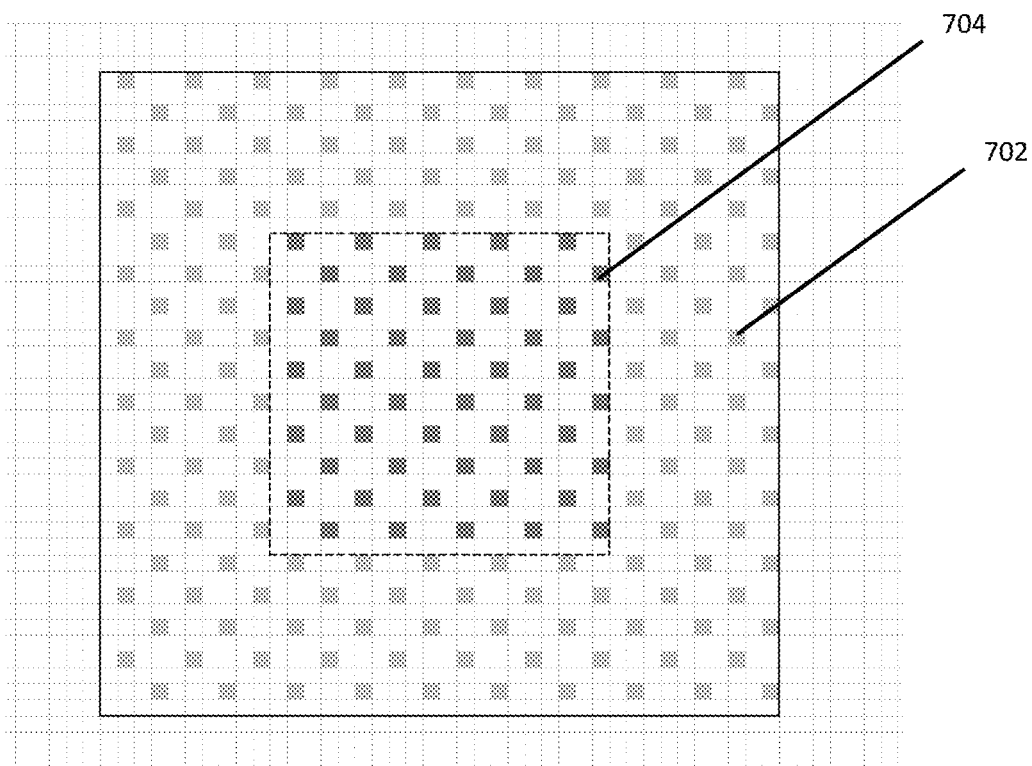
FIG. 7 depicts exemplary print details showing different pixel boost intensities in the centre and edge regions applied with respect to the same MCWSI pattern in both regions.

In order to obtain an applied screen pattern 704 in the center that is the same as the screen pattern 702 on the edge (e.g. MCWSI), as shown in FIG. 7, while having two different pixel boosts in the two different regions, another method step may be included. In this method, a filter is applied that only images every second track of the edge region pattern. The use of an appropriate input pattern in the edge region conjunction with such a filter results in actual application of a pattern identical to the centre pattern.

Figure 8A:
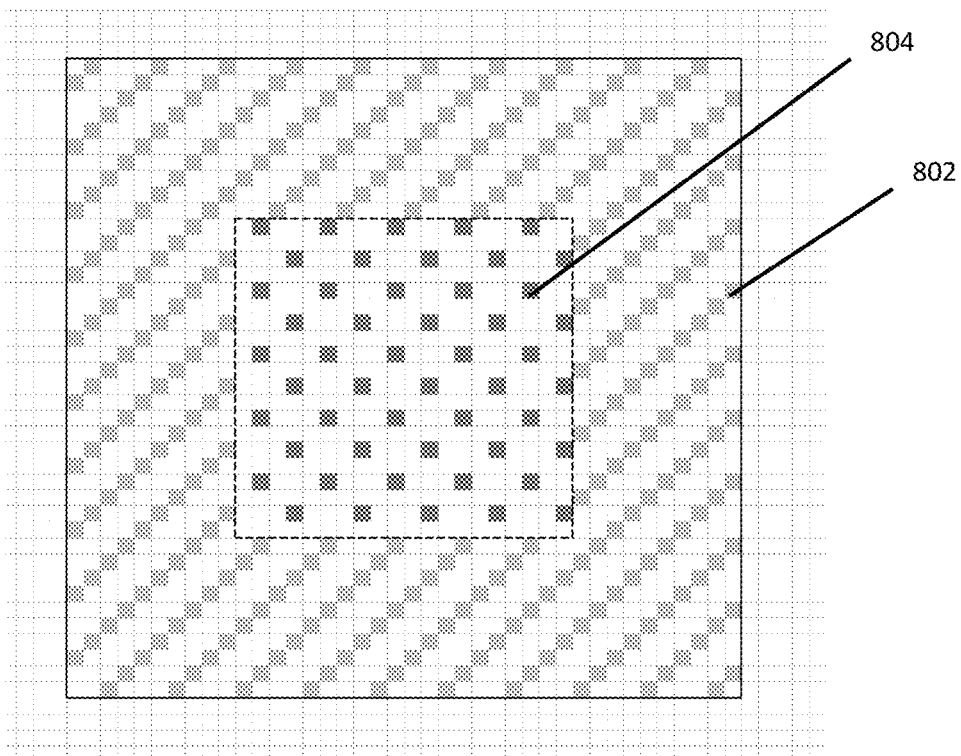
FIG. 8A depicts exemplary print details showing an exemplary combination of an "MG34 Groovy" input pattern in the edge region and the MCWSI pattern for the centre region.
Figure 8B:
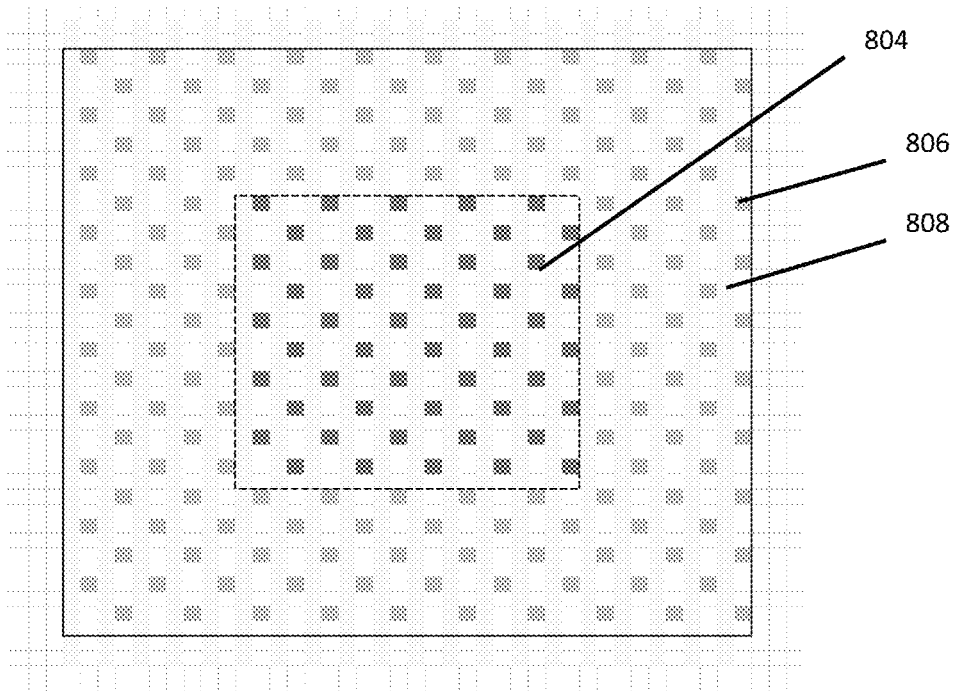
FIG. 8B depicts exemplary print details showing an exemplary resulting output pattern after processing with the output filter operation as described above.

FIG. 8A shows an exemplary combination of an "MG34 Groovy" input pattern 802 for the edge regions and MCWSI pattern 804 for the centre region. FIG. 8B shows the resulting output pattern 806 after processing with the output filter operation as described above. The output filter is depicted in the figure schematically as vertical lightly shaded lines 808 that are applied to turn "off" the corresponding pixels that intersect with those lines from the groovy pattern 804, as depicted in the edge region in FIG. 8A.

This filter may be exclusively applied to the imaging of the micro screen pattern of edge regions (despite the continuation of the vertical lines as depicted in FIG. 8A, showing that in some embodiments it may also be applied in the center regions of linework print regions), while all other content of the image file—including screen artwork that does not comprise a single pixel screen—is imaged as indicated by the image file, without modification.

The methods and procedures as described above are not limited to the use of only two different patterns, but may also be applied to three or more different patterns, each having a different boost factor, and each resulting in different mask openings as compared to the other patterns. The invention is also not limited to any particular output filter. A filter that switches off every odd pixel in a circumferential (vertical) direction on the imaging cylinder or a filter that switches off a combination of vertical and horizontal pixels may also be employed.

Figure 9A:
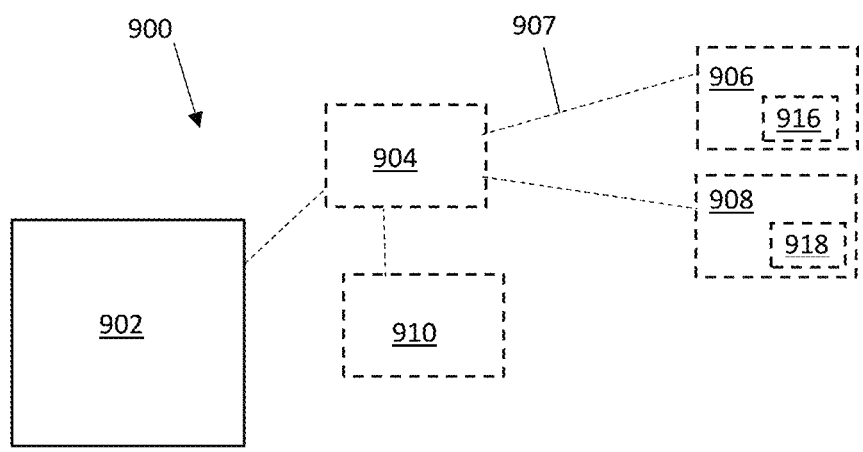
FIG. 9A illustrates an exemplary system for carrying out the exemplary methods as described herein.
Figure 9B:
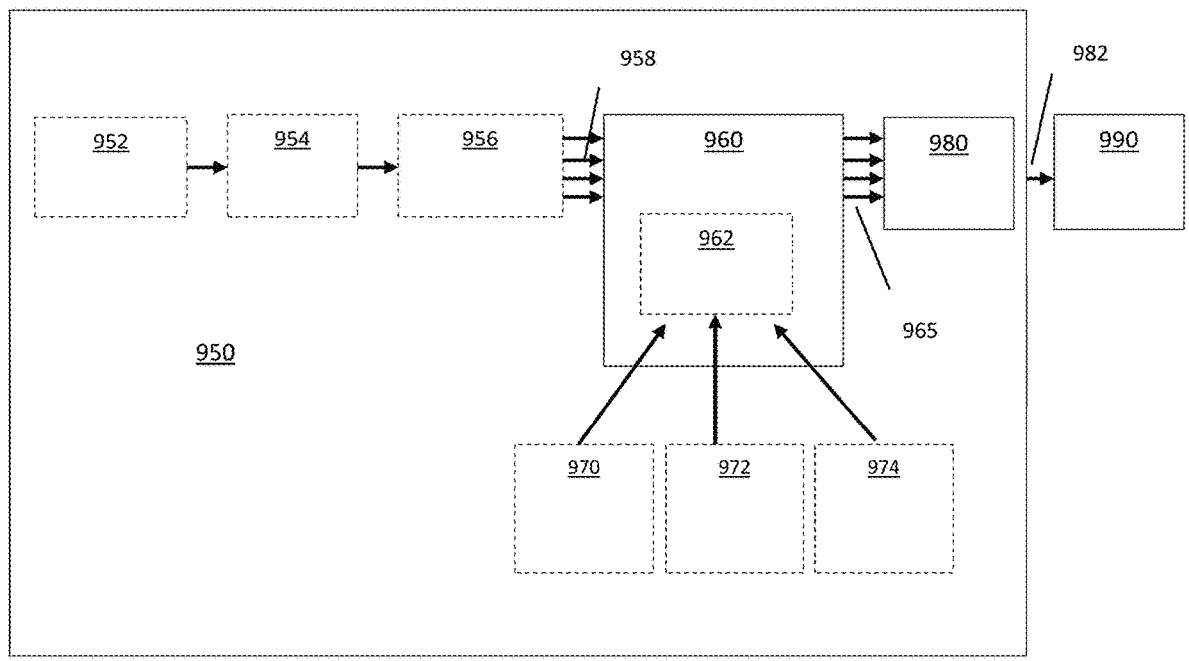
FIG. 9B illustrates exemplary data flow in an imager configured to perform aspects of an exemplary method as described herein.

An exemplary system 900 for carrying out embodiments of the invention as described herein, as depicted in FIG. 9A, comprises an imager 902, a controller for the imager 904, and computer memory media 906 programmed with a first set of machine-readable instructions corresponding to the image file 916, and computer memory media 908 programmed with a second set of machine-readable instructions 918 for causing the controller for the imager to transform image information in the image file to commands for causing the imager to create openings in the mask. The image includes solid or linework image regions, which correspond to solid or linework mask regions that are created in the mask, which correspond to solid or linework plate regions that are formed in the exposed plate, which correspond to solid or linework print regions printed by the plate on a printed substrate. The instructions include instructions for causing the imager to create mask openings in an edge region of the solid or linework mask regions that are smaller than openings in a center region of the solid or linework mask regions, as described herein. The hardware or firmware of the imager 910 is configured to allocate the first laser light intensity and the second laser light intensity based upon the information in the image file. In some embodiments, corresponding to Exemplary Method 1 as described above, the imager is configured to receive a digital data stream 907 from memory 906, corresponding to the image file 916, and to detect the image file edge region and the image file center region in the digital data stream. In embodiments, corresponding to Exemplary Method 3 as described above, the image file stored in memory 908 includes a first micro screen having a first pattern corresponding to the edge region, and a second micro screen having a second pattern corresponding to the center region, and the imager is configured to detect whether the digital data stream information corresponds to the first or second micro-screen, and apply the corresponding first or second laser light intensity, accordingly. In other embodiments, corresponding to Exemplary Method 2 as described above, the image file stored in memory 916 comprises 3-dimensional information corresponding to each pixel, comprising at least an X-coordinate, a Y-coordinate, and a laser ablation intensity. Although depicted as separate memory areas 906 and 908, a single computer memory may be provided to house the image file and the instructions for causing the controller to cause the imager 902 to instructions.

Figure 10:
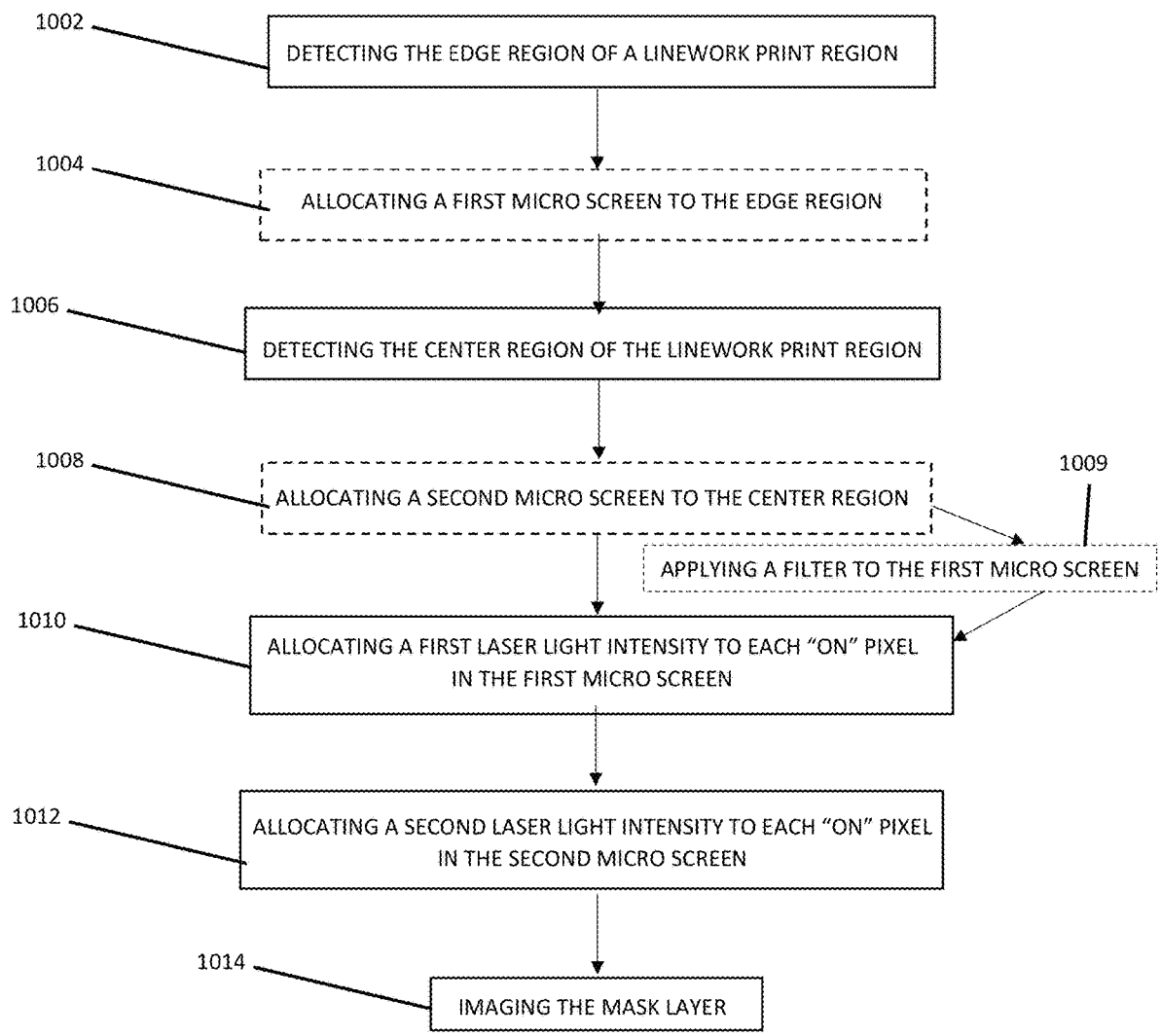
FIG. 10 is a flowchart illustrating exemplary method steps of one aspect of the invention.

In summary, embodiments for carrying out the method steps of the invention may include, as depicted in FIG. 10, in step 1002, detecting in the image file an image file edge region corresponding to the edge region of the linework print region, and in step 1004, allocating a first micro screen having a first pattern to the corresponding edge region. In step 1006, the method includes detecting in the image file an image file center region corresponding to the center region of the linework print region, and in step 1008, allocating a second micro screen to the corresponding center region, wherein the second micro screen has a second pattern different from the first pattern. In step 1010, a first laser light intensity is allocated to each "on" pixel in the first micro screen, and in step 1012, a second laser light intensity is allocated to each "on" pixel in the second micro screen. Then, in step 1014, the mask layer of the printing plate is imaged according to the information in the image file using the first laser light intensity for the first micro screen and the second laser light intensity for the second micro screen. Some embodiments include an optional step 1113 of switching "off" selected "on" pixels in the edge region such that imaged areas of the mask corresponding to the edge region of the linework print region form a pattern identical to the second pattern. In other embodiments, the steps 1008 and 1010 of respectively allocating the first laser light intensity and the second laser light intensity are performed by hardware or firmware 910 of the imager 902.

In another embodiments, rather than performing steps 1004 and 1008 of allocating first and second micro screens to the edge region and center region, respectively, the detection steps occur in the RIP, and the steps 1010, 1012 of allocating the first laser light intensity and the second laser light intensity include storing information corresponding to the first laser light intensity and the second laser light intensity as information in the image file.

Notably, in addition to the solid rendition and linework areas, some imaged areas may contain image details (e.g. highlight areas) that have no micro-screens. Such image details are imaged in a conventional way, without boosting. In other embodiments, highlight areas may also have micro-screens, and those areas may have related boosting, but without a need for differentiation between the degree of boosting of the micro-screens corresponding to edge and center regions of the highlight area. Of course, the general method of, and related systems for, applying a first micro-screen in a first area of an image, and a second micro-screen in a second area of an image, with different boost percentages applied based upon those differences in the micro-screens, are not limited only to applications relating to detection and implementation across edge and center regions of sold rendition or linework areas. Accordingly, other uses may be found for the use of different micro-screens corresponding to different boosting in different areas of an image, and the invention is not limited to any particular use.

EXAMPLES

A number of print tests were performed using the following press parameters in accordance with the details shown in Table 2, below:

Anilox 1: 420 L/cm, 3.5 cm$^3$/m$^2$, hexagonal, Hersteller: Inometa
Anilox 2: 340 L/cm, 4.8 cm$^3$/m$^2$
Tape 1: Lohmann 5.2
Tape 2: Lohmann 5.3
DBS/RWBS (see Notes): 70/60 μm after Kissprint
Ink 1: NC (Siegwerk NC 402-Lb Magenta)
Ink 1 Viscosity: 21 s (hole diameter 4 mm, according to DIN 53211)
Ink 2: PU (Siegwerk UR 11-4 Magenta MB 56)
Ink 2 Viscosity: 21 s (hole diameter 4 mm, according to DIN 53211)
Press: Fischer & Krecke 6S/8
Speed: 200 m/min
Print substrate: LDPE55 μm white pre-treated
Corona: 2000 W
Notes: "DBS" is an acronym for "Druck Beistellung," which is known in the art as a measure of the printing pressure adjustment of the printing roll relative to the print substrate; "RWBS" is an acronym for "Raster Walzen Beistellung," which is known in the art as a measure of the printing pressure adjustment of the anilox roll to the Printing roll. Viscosity units of "s" corresponds to "seconds," in accordance with the DIN 53211 standard, using an ISO 2431 flow cup.

Multiple print samples were made to evaluate the influence of different print conditions on the trailing edge effect. To adapt to the wide variety of screens, a test matrix including variation in the boost range for the edge region from 200% to 400% in 25% steps and variation in the boost range for the center region from 200% to 375% in 25% steps. All tests were made with a 150% pulse width on a DuPont® Cyrel® DPR 045 plate using the imager of an Esko® CDI Crystal 4260 unit with an Optics80 optical system set at 6 m$^2$/h productivity.

Results showed that even a small 0.25 pt border was sufficient to avoid undesired trailing edge effects, whereas wider borders tended to make the border area more recognizable.

Using a 0.25 pt border, results were assed for Test 1, as shown in Table 1, below:

TABLE 1

| Edge Boost (%) | Center Boost (%) | | | | | | | |
|---|---|---|---|---|---|---|---|---|
| | 200 | 225 | 250 | 275 | 300 | 325 | 350 | 375 |
| 200 | No Good | No Good | No Good | No Good | No Good | No Good | No Good | No Good |
| 225 | No Good | No Good | No Good | No Good | No Good | No Good | No Good | No Good |
| 250 | No Good | No Good | No Good | No Good | Acceptable | Acceptable | Acceptable | Acceptable |
| 275 | No Good | No Good | No Good | No Good | Acceptable | Excellent | Excellent | Excellent |
| 300 | No Good | No Good | No Good | No Good | Acceptable | Acceptable | Acceptable | Acceptable |
| 325 | No Good | No Good | No Good | No Good | No Good | No Good | No Good | No Good |
| 350 | No Good | No Good | No Good | No Good | No Good | No Good | No Good | No Good |
| 375 | No Good | No Good | No Good | No Good | No Good | No Good | No Good | No Good |
| 400 | No Good | No Good | No Good | No Good | No Good | No Good | No Good | No Good |

Figure 12A:
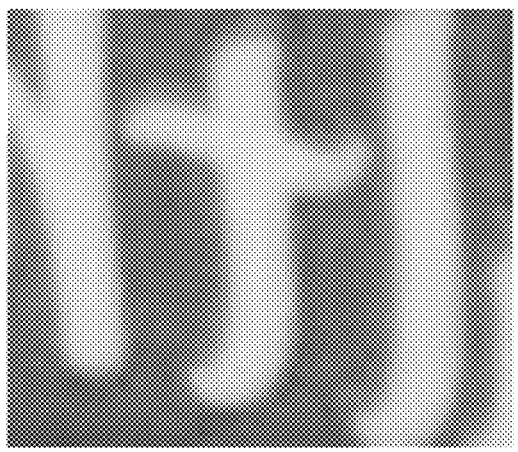
FIG. 12A is a photograph of an enlarged portion of a first sample of a printed image produced using an optimal ratio of edge boost to center boost.
Figure 12B:
FIG. 12B is a is a photograph of a corresponding enlarged portion of a second sample the same printed image depicted in FIG. 12A, produced with a suboptimal ratio of edge boost to center boost.

For the center regions, the highest solid ink density (SID) with good ink laydown was found in the boost range from 325%-375%. For edge regions, the best results for lowest visibility of trailing edges were found at a boost of 275%. Below 250%, boost in the edge regions, the homogeneity of the SID of the ink film was not good, and above 300% boost in the edge regions, the trailing edges started to become visible. The essence the differences found from this test can be seen in the comparison of FIG. 12A, depicting the result at a "sweet spots" of 275/325 (275% Boost in the edge region and 325% Boost in the center region) versus FIG. 12B, depicting the result at 325/325.

Additional testing examined various boost factor combinations in combinations with different ink type, anilox screen/volume and adhesive tape, with all other parameters noted above held constant. The best results from each of these tests are provided in Table 2, below.

TABLE 2

| Test | Ink | Anilox | Tape | Best Boost combination | Background SID | Overall assessment |
|---|---|---|---|---|---|---|
| 1 | NC | 420 | 5.2 | 275/325 | 1.48 | Best result -- no visible pinholes |
| 2 | NC | 420 | 5.3 | — | — | Not printed |
| 3 | NC | 340 | 5.2 | 275/325 | 1.46 | Still slight pinholes at trailing edge side |
| 4 | NC | 340 | 5.3 | 275/350 | 1.51 | Good result |
| 5 | PU | 420 | 5.2 | 275/325 | 1.46 | Still slight pinholes attrailing edge side |
| 6 | PU | 420 | 5.3 | 275/350 | 1.50 | Still slight pinholes at trailing edge side |
| 7 | PU | 340 | 5.2 | 275/325 | 1.57 | Almost good - (Only very little pinholes) |
| 8 | PU | 340 | 5.3 | 275/350 | 1.58 | Almost good - (Only very little pinholes) |

The testing showed that the principles disclosed herein are effective at minimizing trailing edge effects. The testing also showed that a certain ratio for the boost of the center area pattern vs. boost of the edge area pattern may be acceptable across a broad number of conditions. The testing showed that the sweet spot for best mitigation of the effect was at a boost of 275% for edge areas, while the best boost for center areas was 350%, which corresponds to a ratio of edge boost to center boost of 275/350=0.785.

Table 1 shows the boost for center areas can range between 325% and 375% while still maintaining an acceptable SID for the center areas. Varying the center area boost between the foregoing values while maintaining the same edge/center area boost ratio would result in application of an edge boost at 255% and 294%, respectively, which is still in the acceptable range according to Table 1. Based solely on the table, a range of acceptable values for the ratio would extend at least from 250/325 (0.77) to 300/375 (0.8) for the overall parameters represented for that test (and beyond, as only 25% increments were tested). Accordingly, a preferred ratio is in the range 0.65-0.85, more preferably in the range 0.77 to 0.8, and even more preferably 0.785.

Therefore, instead of performing a complicated matrix test to determine the sweet spot for each image/set of printing conditions, an acceptable method may include determining only the optimum boost for the center area (which is a common procedure already practiced in the field) and then applying the predetermined ratio to calculate the edge boost setting, thus simplifying implementation of embodiments of the invention. Although a preferred ratio of 0.785 was found acceptable and applied in the foregoing example, it should be understood that the ratio is not limited to any particular value or range of values, and the predetermined ratio value or the acceptable range of ratio values may vary depending on the systems used in the platemaking workflow and their operating conditions, printing systems and settings, and features of the image to be printed. In particular, parameters of the anilox roll and spot size of the imager may be expected to affect the optimum ratio and acceptable ranges thereof.

Figure 13A:
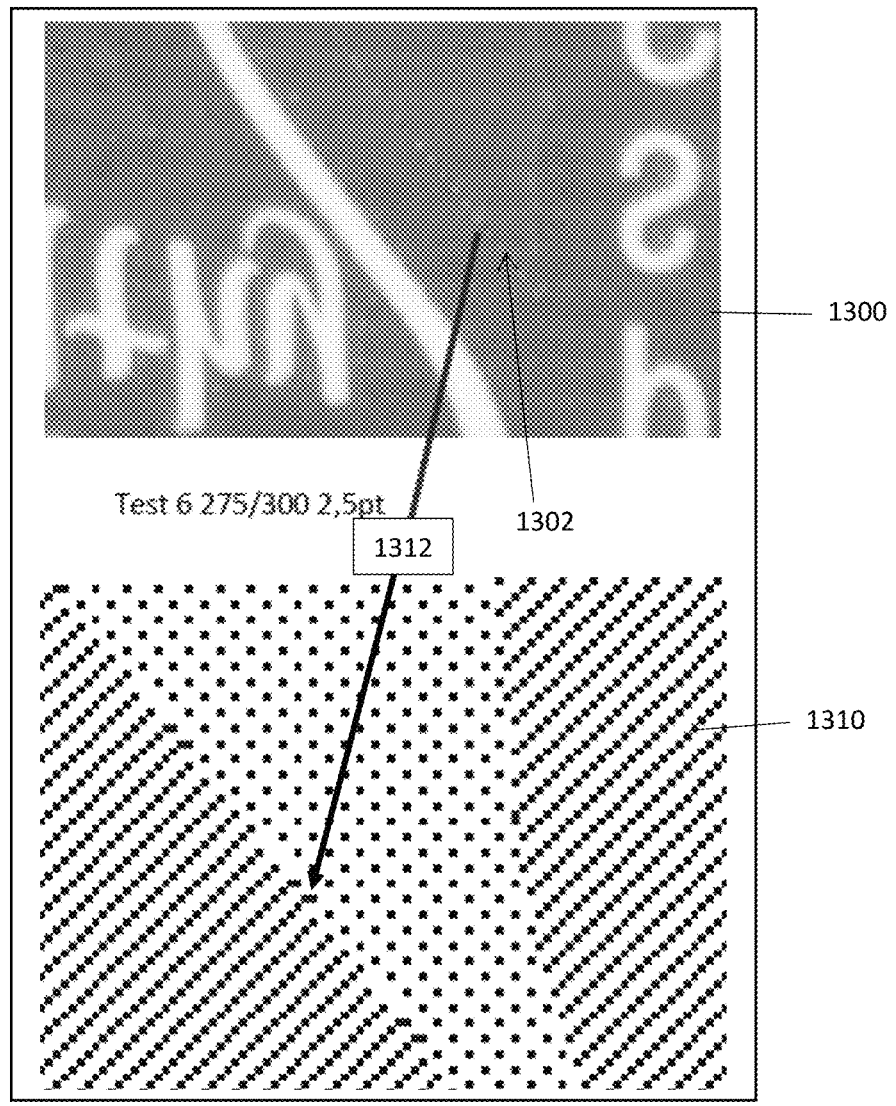
FIG. 13A is a photograph of an enlarged portion of a printed sample exhibiting pinholes at a transition area from a center region to an edge region, and a rendering of the like portion of a bitmap corresponding thereto.
Figure 13B:
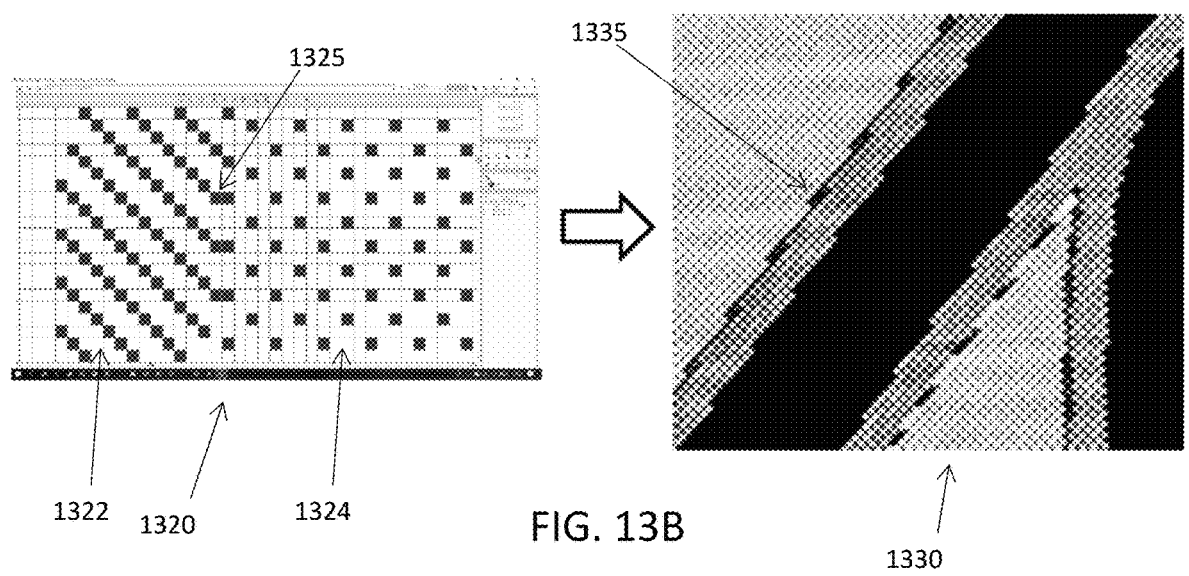
FIG. 13B is a captured screen image of a portion of a .LEN file representative of the transition area depicted in FIG. 13A, and a corresponding enlarged portion of the ablated mask, both showing pixel clusters (non-isolated pixels) resulting from suboptimal alignment between the center pattern and the edge pattern.

The testing also showed some print samples having optimized boost combinations still showed pinholes around vignettes seemingly independent of the trailing edge effect, because they appeared in areas that were not located close to an edge. It was found that these pinholes occurred at the transition between the different screen patterns for the edge region and the center region, as illustrated in FIG. 13A, depicting a photo 1300 of a printed sample with a 2.5 pt border having pinholes 1302 as compared to a rendering 1310 (an excerpt from a .LEN file) of the corresponding dot pattern, with arrow 1312 extending from the pinholes to corresponding pixel clusters (non-isolated pixels) in the rendering. Further inspection of pixel placement, as shown in FIG. 13B, which depicts a screen capture 1320 of the .LEN file versus the corresponding ablated mask 1330, shows that that certain pixels in the edge pattern 1322 are not positioned in alignment with adjacent pixels of center pattern 1324, resulting in a shift between the two patterns that results in some pixel clusters 1325 (non-isolated pixels) at the transition between patterns, corresponding to visible clusters 1335 in the ablated mask. Accordingly, aligning the center pattern to the edge pattern to avoid a visible discontinuity (e.g. non-isolated pixels) in the pixel positions at a transition between the edge pattern and the center pattern optimizes performance. This is in part because non-isolated pixels are not identified for boosting by the imager, creating an anomalous result. Thus, "alignment" as used herein refers to a relative positioning of the respective patterns that avoids pixel clusters (i.e. non-isolated pixels) at the transition between patterns.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A method for minimizing voids in front of a trailing edge of a solid rendition or linework print region printed using a flexographic printing plate having a printing surface corresponding to information in an image file, the information in the image file including at least one solid rendition or linework image region corresponding to the solid rendition or linework print region, the at least one solid rendition or linework image region including micro-screen information comprising a pattern of "on" and "off" single pixels, the flexographic printing plate comprising a photopolymer cured through openings in a mask layer of the plate, the openings in the mask layer formed by an imager, the mask layer having a solid rendition or linework mask region corresponding to each solid rendition or linework print region, the method comprising providing mask micro-screen openings in an edge region of the solid rendition or linework mask region that have a different size than micro-screen openings in a center region of the solid rendition or linework mask region;

wherein the method comprises the steps of:
- a) detecting in the image file, an image file edge region corresponding to the edge region of the solid rendition or linework print region;
- b) detecting in the image file, an image file center region corresponding to the center region of the solid rendition or linework print region;
- c) allocating a first laser light intensity to each "on" pixel in the edge region;
- d) allocating a second laser light intensity to each "on" pixel in the center region; and
- e) imaging the mask layer of the printing plate according to the information in the image file using the first laser light intensity for the edge region and the second laser light intensity for the center region; and wherein the method further comprises determining an optimum value for the second laser light intensity for the image file, applying a predetermined ratio of second laser light intensity to first laser light intensity to determine a corresponding value for the first laser light intensity, and imaging the mask layer of the printing plate using the optimum value for the second laser light intensity and the corresponding value for the first laser light intensity.

2. The method of claim 1, further comprising:
allocating a first micro screen having a first pattern to the corresponding edge region comprising when imaging the mask layer; and
allocating a second micro screen to the corresponding center region, wherein the second micro screen has a second pattern different from the first pattern.

3. The method of claim 2, further comprising aligning the second pattern to the first pattern to avoid a discontinuity at a transition between the first pattern and the second pattern.

4. The method of claim 2, further comprising switching "off" selected "on" pixels in the edge region such that imaged areas of the mask corresponding to the edge region of the linework print region form a pattern identical to the second pattern.

5. The method of claim 1, comprising allocating the first laser light intensity and the second laser light intensity in hardware or firmware of the imager.

6. The method of claim 1, comprising storing information corresponding to the first laser light intensity and the second laser light intensity in the image file.

7. The method of claim 1, further comprising allocating a gradient of laser light intensities including the first laser light intensity, the second laser light intensity, and one or more other laser light intensities different from the first light intensity and the second light intensity, in accordance with a function.

8. The method of claim 1, wherein the steps of detecting the image file edge region and detecting the image file center region are performed by the imager on a digital data stream corresponding to the imaging file.

9. The method of claim 1, wherein the information in the image file further includes at least one halftone image region including halftone screen information comprising a pattern of "on" and "off" groups of pixels, each group of pixels comprising two or more single pixels.

10. The method of claim 1, wherein the predetermined ratio is in a range 0.65-0.85.

11. The method of claim 10, wherein the predetermined ratio is in a range of 0.77-0.8.

12. The method of claim 11, wherein the predetermined ratio is 0.785.

13. A system for minimizing voids in front of a trailing edge of a solid rendition or linework print region printed using a flexographic printing plate having a printing surface corresponding to information in an image file, the flexographic printing plate comprising a photopolymer cured through openings in a mask layer of the plate, the openings in the mask layer formed by an imager, the mask layer comprising a solid rendition or linework mask region corresponding to each solid rendition or linework print region, the openings in the solid rendition or linework mask region including micro-screen openings each corresponding to an "on" pixel in a micro-screen comprising a pattern of "on" and "off" pixels, the system comprising:
an imager;
a controller for the imager;
computer memory media programmed with a first set of machine-readable instructions corresponding to the image file;
computer memory media programmed with a second set of machine-readable instructions for causing the controller for the imager to transform image information in the image file to commands for causing the imager to create openings in the mask, the instructions comprise instructions for causing the imager to create micro-screen openings in an edge region of the solid rendition or linework mask region that are smaller than in a center region of the linework mask region;

wherein the second set of machine-readable instructions comprising instructions for causing the controller to perform the steps of:
- a) detecting in the image file, an image file edge region corresponding to the edge region of the linework print region;
- b) detecting in the image file, an image file center region corresponding to the center region of the linework print region;

and the system is configured to:
allocate a first laser light intensity to each "on" pixel in the first micro screen and allocate a second laser light intensity to each "on" pixel in the second micro screen; and
image the mask layer of the printing plate according to the information in the image file using the first laser light intensity for the first micro screen and the second laser light intensity for the second micro screen; and wherein the system is programmable to receive a user defined second laser light intensity value and to allocate the first laser light intensity relative to the second laser light intensity based upon a predetermined ratio of second laser light intensity to first laser light intensity.

14. The system of claim 13, wherein the second set of machine-readable instructions further comprises instructions for:
allocating a first micro screen having a first pattern to the corresponding edge region; and
allocating a second micro screen to the corresponding center region, wherein the second micro screen has a second pattern different from the first pattern.

15. The system of claim 14, wherein the second set of instructions further comprises instructions for switching "off" selected "on" pixels in the edge region such that imaged areas of the mask corresponding to the edge region of the linework print region form a pattern identical to the second pattern.

16. The system of claim 15, wherein the imager comprises hardware or firmware configured to allocate the first laser light intensity and the second laser light intensity based upon the information in the image file.

17. The system of claim 13, wherein the first set of machine-readable instructions comprise information corresponding to the first laser light intensity and the second laser light intensity.

18. The system of claim 17, further comprising a raster imaging processor (RIP) configured to detect the image file edge region and the image file center region and to assign each pixel information corresponding to the first laser light intensity or the second laser light intensity.

19. The system of claim 13, wherein the system is configured for allocating a gradient of laser light intensities including the first laser light intensity, the second laser light intensity, and one or more other laser light intensities different from the first light intensity and the second light intensity, in accordance with a function.

20. The system of claim 13, wherein the imager is configured to receive a digital data stream corresponding to the imaging file and to detect the image file edge region and the image file center region in the digital data stream.

21. The system of claim 13, wherein the image file further includes at least one halftone print region and the mask comprises a corresponding halftone mask region, wherein the halftone mask region also includes micro-screen openings.

22. The system of claim 21, wherein the image file further includes at least one halftone print region and the mask comprises a corresponding halftone mask region, wherein the halftone mask region has openings that do not include micro-screen openings.

23. The system of claim 13, wherein the predetermined ratio is in a range 0.65-0.85.

24. The system of claim 23, wherein the predetermined ratio is in a range of 0.77-0.8.

25. The system of claim 24, wherein the predetermined ratio is 0.785.

26. Non-transitory computer readable media programmed with instructions readable by a controller of an imager for causing the controller of the imager to transform information in an image file to commands for causing the imager to laser ablate openings in a mask layer of a flexographic printing plate, the information in the image file including at least one halftone image region and at least one solid rendition or linework image region corresponding to the solid rendition or linework print region, the at least one solid rendition or linework image region including micro-screen information comprising a pattern of "on" and "off" single pixels and the at least one halftone image region including halftone screen information comprising a pattern of "on" and "off" groups of pixels, each group of pixels comprising two or more single pixels, wherein the image file comprises 3-dimensional information corresponding to each pixel, comprising at least an X-coordinate, a Y-coordinate, and a laser ablation intensity, wherein the instructions for transforming information in the image file into commands for causing the imager to laser ablate openings in the mask layer include instructions for causing the imager to laser ablate openings using first laser ablation intensity in an edge region of a linework print region and a second laser ablation intensity in the center region of a linework print region, the first laser ablation intensity being relatively less than the second laser ablation intensity.

27. The non-transitory computer readable media of claim 26, wherein the instructions for transforming information in the image file into commands for causing the imager to laser ablate openings in the mask layer include instructions for causing the imager to laser ablate openings using a gradient including the first laser light intensity, the second laser light intensity, and one or more other laser light intensities different from the first light intensity and the second light intensity, in accordance with a function.

* * * * *